United States Patent
Kishimoto et al.

(10) Patent No.: US 11,101,258 B2
(45) Date of Patent: *Aug. 24, 2021

(54) METHOD AND APPARATUS FOR MANUFACTURING FLEXIBLE LIGHT-EMITTING DEVICE

(71) Applicant: SAKAI DISPLAY PRODUCTS CORPORATION, Sakai (JP)

(72) Inventors: Katsuhiko Kishimoto, Sakai (JP); Kohichi Tanaka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/968,052

(22) PCT Filed: May 9, 2018

(86) PCT No.: PCT/JP2018/017901
§ 371 (c)(1),
(2) Date: Oct. 7, 2020

(87) PCT Pub. No.: WO2019/215832
PCT Pub. Date: Nov. 14, 2019

(65) Prior Publication Data
US 2021/0035963 A1  Feb. 4, 2021

(51) Int. Cl.
*H01L 25/16* (2006.01)
*H01L 27/32* (2006.01)
(Continued)

(52) U.S. Cl.
CPC ........ *H01L 25/167* (2013.01); *H01L 27/3244* (2013.01); *H01L 51/0097* (2013.01); *H01L 27/1266* (2013.01); *H01L 2227/326* (2013.01)

(58) Field of Classification Search
CPC .............. H01L 25/167; H01L 27/3244; H01L 51/0097

See application file for complete search history.

(56) References Cited

U.S. PATENT DOCUMENTS

2010/0181584 A1* 7/2010 Gao ..................... H01L 33/44
257/98
2014/0042649 A1  2/2014 Ke et al.
(Continued)

FOREIGN PATENT DOCUMENTS

JP  2012-009642 A  1/2012
JP  2014-048619 A  3/2014
(Continued)

*Primary Examiner* — Thao X Le
*Assistant Examiner* — Xia L Cross
(74) *Attorney, Agent, or Firm* — ScienBiziP, P.C.

(57) ABSTRACT

According to a flexible light-emitting device production method of the present disclosure, after an intermediate region (30*i*) and a flexible substrate region (30*d*) of a plastic film (30) of a multilayer stack (100) are divided, the interface between the plastic film (30) and a glass base (10) is irradiated with lift-off light. The multilayer stack (100) is separated into the first portion (110) and the second portion (120) while the multilayer stack (100) is kept in contact with the stage (212). The first portion (110) includes the intermediate region (30*i*) and a light-emitting device (1000) which are adhered to the stage (212). The light-emitting device (1000) includes a functional layer region (20) and the flexible substrate region (30*d*). The second portion (120) includes the glass base (10). The intermediate region (30*i*) adhered to the stage (212) is removed from the stage while the light-emitting device (1000) is kept adhered to the stage.

14 Claims, 25 Drawing Sheets

(51) Int. Cl.
*H01L 51/00* (2006.01)
*H01L 27/12* (2006.01)

(56) References Cited

U.S. PATENT DOCUMENTS

| | | | |
|---|---|---|---|
| 2014/0332150 A1* | 11/2014 | Hirakata | ............... B32B 38/10 |
| | | | 156/247 |
| 2015/0059987 A1 | 3/2015 | Kumakura et al. | |
| 2018/0068995 A1* | 3/2018 | Kajiyama | ............... H01L 25/50 |
| 2019/0044096 A1 | 2/2019 | Tanaka | |
| 2019/0363264 A1 | 11/2019 | Kishimoto et al. | |
| 2019/0363299 A1 | 11/2019 | Kishimoto et al. | |
| 2019/0363300 A1 | 11/2019 | Kishimoto et al. | |
| 2019/0392736 A1 | 12/2019 | Kishimoto et al. | |
| 2020/0168820 A1 | 5/2020 | Tanaka et al. | |

FOREIGN PATENT DOCUMENTS

| | | | |
|---|---|---|---|
| JP | 2015-173088 A | 10/2015 | |
| JP | 2017-191283 A | 10/2017 | |
| JP | 2017-194520 A | 10/2017 | |
| JP | 6333502 B1 | 5/2018 | |
| JP | 6334077 B1 | 5/2018 | |
| JP | 6334078 B1 | 5/2018 | |
| JP | 6334079 B1 | 5/2018 | |
| JP | 6334080 B1 | 5/2018 | |
| WO | 2015/190418 A1 | 12/2015 | |
| WO | 2017/115484 A1 | 7/2017 | |

\* cited by examiner

METHOD AND APPARATUS FOR MANUFACTURING FLEXIBLE LIGHT-EMITTING DEVICE

TECHNICAL FIELD

The present disclosure relates to a method and apparatus for producing a flexible light-emitting device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the light-emitting is likely to deteriorate due to water vapor.

Production of the above-described flexible display is carried out using a glass base on which a plastic film is formed over the upper surface. The glass base functions as a support (carrier) for keeping the shape of the plastic film flat during the production process. TFT devices, light-emitting devices such as OLEDs, a gas barrier film, and the other constituents are formed on the plastic film, whereby the structure of a flexible display is realized while it is supported by the glass base. Thereafter, the flexible display is delaminated from the glass base and gains flexibility. The entirety of a portion in which TFT devices and light-emitting devices such as OLEDs are arrayed can be referred to as "functional layer region".

According to the prior art, a sheet-like structure including a plurality of flexible displays is delaminated from a glass base, and thereafter, optical parts and other constituents are mounted to this sheet-like structure. Thereafter, the sheet-like structure is divided into a plurality of flexible devices. This dividing is realized by, for example, laser beam irradiation.

Patent Document No. 1 discloses the method of irradiating the interface between each flexible display and the glass base with laser light in order to strip each flexible display from the glass base (supporting substrate). According to the method disclosed in Patent Document No. 1, after irradiation with the lift-off light, respective flexible displays are divided from one another, and each of the flexible displays is delaminated from the glass base.

CITATION LIST

Patent Literature

Patent Document No. 1: Japanese Laid-Open Patent Publication No. 2014-48619

SUMMARY OF INVENTION

Technical Problem

According to the conventional production method, the dividing by means of laser beam irradiation is carried out after expensive parts, for example, encapsulation film, polarizer, and/or heat radiation sheet, are mounted to a sheet-like structure including a plurality of flexible displays. Therefore, unnecessary parts divided by laser beam irradiation, i.e., parts which are not to be constituents of a final display, are quite useless. Also, there is a problem that, after being delaminated from the glass base, it is difficult to handle a plurality of flexible displays which have no rigidity.

Such a problem is not limited to flexible displays which include OLEDs as light-emitting devices but can arise in producing a flexible light-emitting device which includes a micro LED (µLED) formed as a light-emitting device using inorganic semiconductor materials.

The present disclosure provides a method and apparatus for producing a flexible light-emitting device which are capable of solving the above-described problems.

Solution to Problem

The flexible light-emitting device production method of the present disclosure includes, in an exemplary embodiment: providing a multilayer stack which has a first surface and a second surface, the multilayer stack including a glass base which defines the first surface, a functional layer region including a TFT layer and a light-emitting device layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, dividing the intermediate region and the flexible substrate region of the synthetic resin film from each other, irradiating an interface between the synthetic resin film and the glass base with lift-off light, and separating the multilayer stack into a first portion and a second portion by increasing a distance from a stage to the glass base while the second surface of the multilayer stack is kept in contact with the stage. The first portion of the multilayer stack includes the intermediate region of the synthetic resin film and a light-emitting device which are adhered to the stage, the light-emitting device including the functional layer region and the flexible substrate region of the synthetic resin film. The second portion of the multilayer stack includes the glass base. This production method further includes removing the intermediate region of the synthetic resin film adhered to the stage from the stage while the light-emitting device is kept adhered to the stage.

In one embodiment, the lift-off light is incoherent light.

In one embodiment, the light-emitting device layer includes a plurality of arrayed micro LEDs, and the lift-off light is laser light.

In one embodiment, the method further includes, after removing the intermediate region of the synthetic resin film from the stage, performing a process on the light-emitting device which is in contact with the stage.

In one embodiment, the process includes any of attaching a dielectric and/or electrically-conductive film to the light-emitting device, cleaning or etching the light-emitting device, and mounting an optical part and/or an electronic part to the light-emitting device.

In one embodiment, separating the multilayer stack into the first portion and the second portion is carried out while the stage holds the second surface of the multilayer stack.

In one embodiment, irradiating the interface between the synthetic resin film and the glass base with the lift-off light is carried out while the stage holds the second surface of the multilayer stack.

In one embodiment, a surface of the stage includes a first region which is to face the light-emitting device and a second region which is to face the intermediate region of the synthetic resin film, and suction in the first region is higher than suction in the second region.

In one embodiment, the method further includes, before bringing the second surface of the multilayer stack into contact with the stage, placing a suction sheet on the stage, the suction sheet having a plurality of openings, wherein the stage includes a porous plate on which the suction sheet is to be placed, and the suction sheet includes a first region which is to be in contact with the plurality of light-emitting devices and a second region which is to face the intermediate region of the synthetic resin film, an aperture ratio of the first region being higher than an aperture ratio of the second region.

The flexible light-emitting device production apparatus of the present disclosure includes, in an exemplary embodiment: a stage for supporting a multilayer stack which has a first surface and a second surface, the multilayer stack including a glass base which defines the first surface, a functional layer region including a TFT layer and a light-emitting device layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, the intermediate region and the flexible substrate region of the synthetic resin film being divided from each other, a lift-off light irradiation unit for irradiating with lift-off light an interface between the synthetic resin film and the glass base in the multilayer stack supported by the stage, and an actuator for increasing a distance from the stage to the glass base while the stage is kept in contact with the second surface of the multilayer stack, thereby separating the multilayer stack into a first portion and a second portion. The first portion of the multilayer stack includes the intermediate region of the synthetic resin film and a light-emitting device which are adhered to the stage, the light-emitting device including the functional layer region, and the light-emitting device including the flexible substrate region of the synthetic resin film. The second portion of the multilayer stack includes the glass base.

In one embodiment, the lift-off light irradiation unit comprises an incoherent light source for emitting the lift-off light.

In one embodiment, the light-emitting device layer includes a plurality of arrayed micro LEDs, and the lift-off light irradiation unit comprises a semiconductor laser device for emitting the lift-off light.

In one embodiment, the stage has a recess which allows holding of the intermediate region at a position which is to face part of the intermediate region of the synthetic resin film included in the first portion of the multilayer stack supported by the stage.

In one embodiment, the stage includes a first region which is to face the plurality of light-emitting devices and a second region which is to face the intermediate region of the synthetic resin film, and suction in the first region is higher than suction in the second region.

In one embodiment, the stage includes a porous plate, and a suction sheet placed on the porous plate, the suction sheet having a plurality of openings, and the suction sheet includes a first region which is to be in contact with the plurality of light-emitting devices and a second region which is to face the intermediate region of the synthetic resin film, an aperture ratio of the first region being higher than an aperture ratio of the second region.

In one embodiment, the stage has a plurality of ejection holes in a region which is to face the intermediate region of the synthetic resin film.

Advantageous Effects of Invention

According to an embodiment of the present invention, a novel method for producing a flexible light-emitting device which is capable of solving the above-described problems is provided.

DESCRIPTION OF EMBODIMENTS

An embodiment of a method and apparatus for producing a flexible light-emitting device of the present disclosure is described with reference to the drawings. Examples of the "light-emitting device" include displays and illumination devices. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

<Multilayer Stack>

Figure 1A:
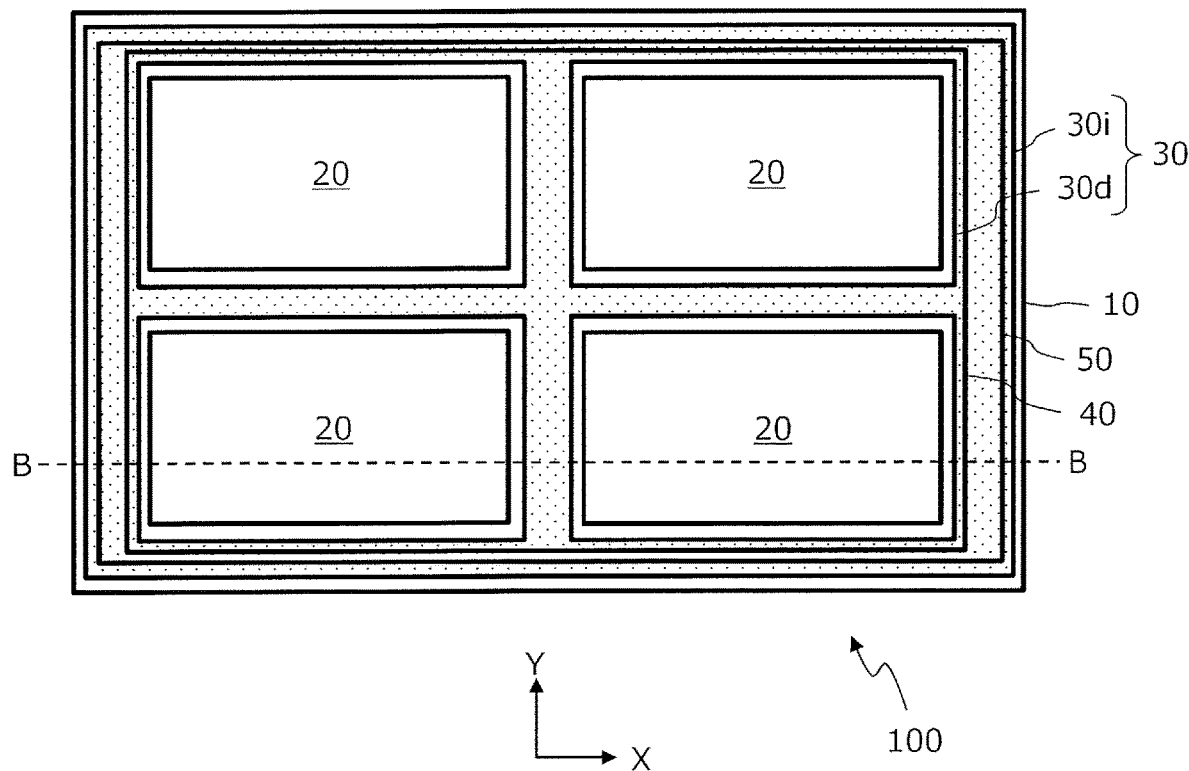
FIG. 1A is a plan view showing a configuration example of a multilayer stack used in a flexible light-emitting device production method of the present disclosure.
Figure 1B:
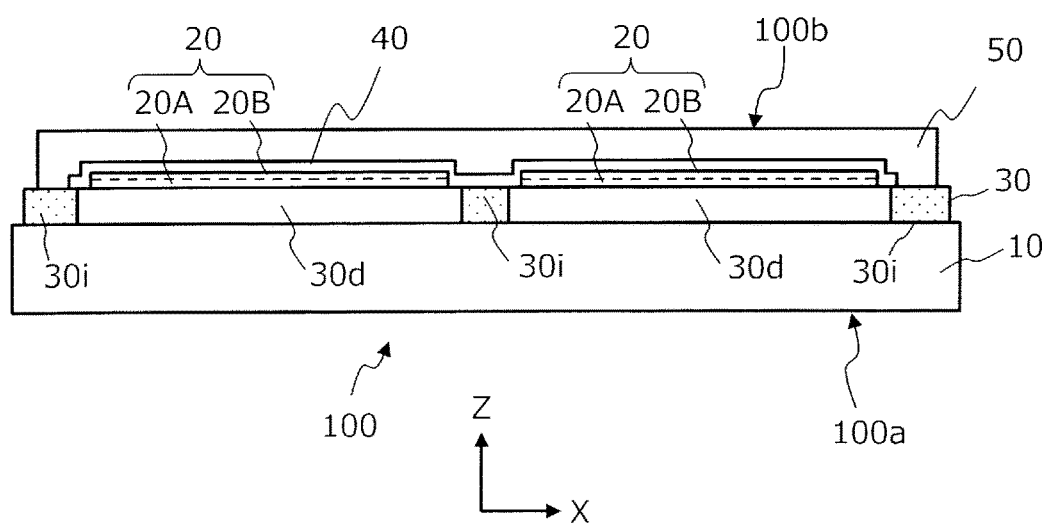
FIG. 1B is a cross-sectional view of the multilayer stack taken along line B-B of FIG. 1A.

See FIG. 1A and FIG. 1B. In a flexible light-emitting device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and a light-emitting device layer 20B, a synthetic resin film (hereinafter, simply referred to as "plastic film") 30 provided between the glass base 10 and the plurality of functional layer regions 20 and bound to the glass base 10, and a protection sheet 50 covering the plurality of functional layer regions 20. The multilayer stack 100 further includes a gas barrier film 40 provided between the plurality of functional layer regions 20 and the protection sheet 50 so as to cover the entirety of the functional layer regions 20. The multilayer stack 100 may include another unshown layer, such as a buffer layer.

In the present embodiment, the light-emitting device layer 20B includes, for example, a plurality of OLEDs which are two-dimensionally arrayed. In the present disclosure, the "light-emitting device layer" refers to a two-dimensional array of light-emitting devices. Each of the light-emitting devices is not limited to an OLED device but may be a micro LED device. In the present embodiment, a typical example of the flexible light-emitting device is a "flexible display" but may be a "flexible illumination device".

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible light-emitting device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible light-emitting device (e.g., display panel). In other words, the multilayer stack 100 has such a structure that a plurality of flexible light-emitting devices which are not yet divided from one another are supported by a single glass base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen or emission surface region. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible light-emitting devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible light-emitting device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of light-emitting devices) supported by a single glass base 10 does not need to be plural but may be singular. If the number of functional layer regions 20 is singular, the intermediate region 30i of the plastic film 30 forms a simple frame pattern surrounding a single functional layer region 20.

The size or proportion of each component illustrated in respective drawings is determined from the viewpoint of understandability. The actual size or proportion is not necessarily reflected in the drawings.

Figure 1C:
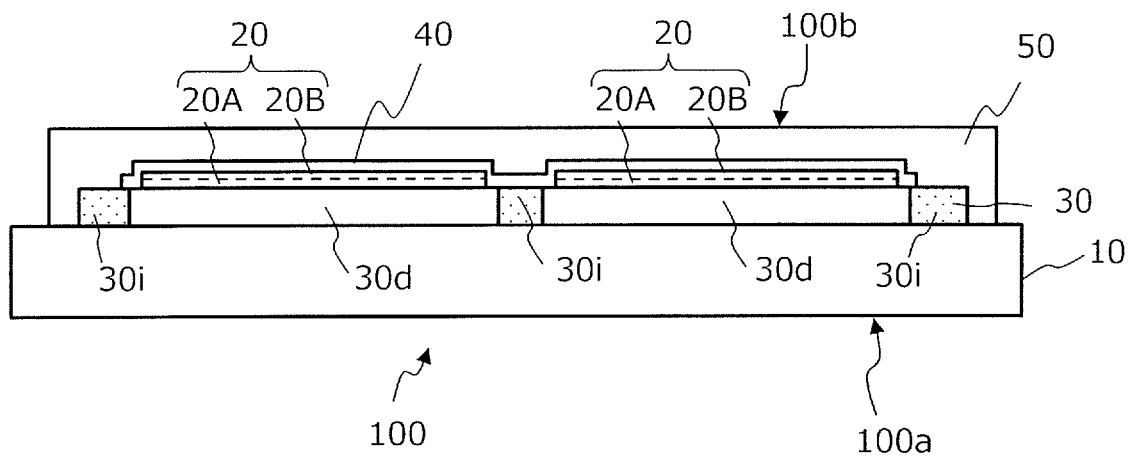
FIG. 1C is a cross-sectional view showing another example of the multilayer stack.
Figure 1D:
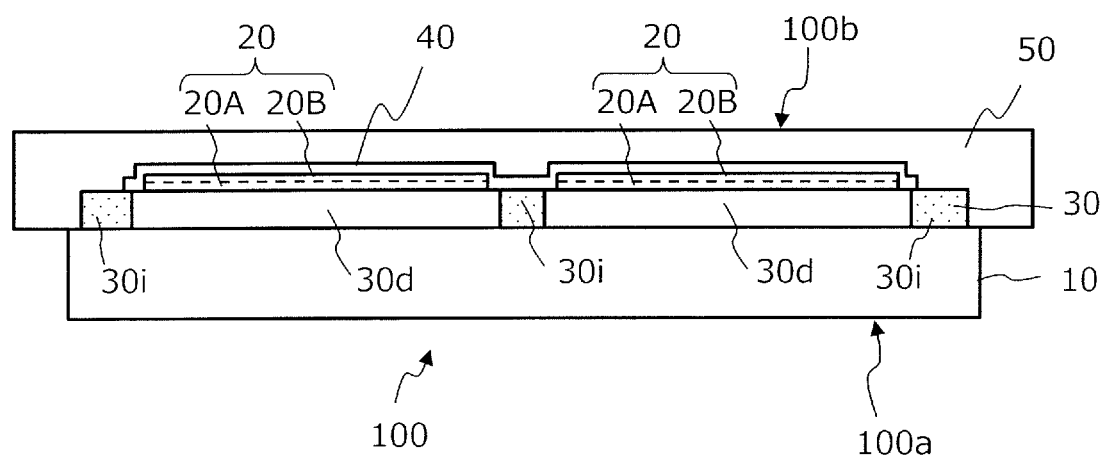
FIG. 1D is a cross-sectional view showing still another example of the multilayer stack.

The multilayer stack 100 which can be used in the production method of the present disclosure is not limited to the example illustrated in FIG. 1A and FIG. 1B. FIG. 1C and FIG. 1D are cross-sectional views showing other examples of the multilayer stack 100. In the example illustrated FIG. 1C, the protection sheet 50 covers the entirety of the plastic film 30 and extends outward beyond the plastic film 30. In the example illustrated FIG. 1D, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing of Light-Emitting Devices>

According to the flexible light-emitting device production method of the present embodiment, after the step of providing the above-described multilayer stack 100, the step of dividing an intermediate region 30i and respective ones of a plurality of flexible substrate regions 30d of the plastic film 30 from one another is carried out.

Figure 2A:
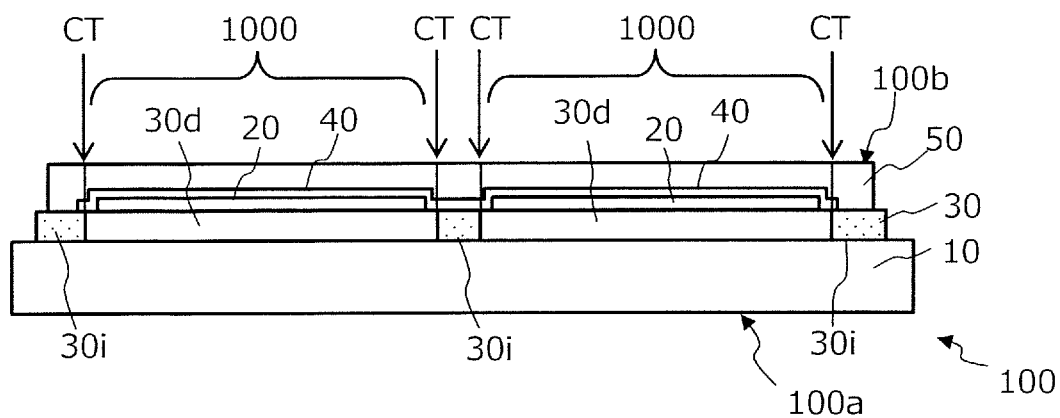
FIG. 2A is a cross-sectional view schematically showing the dividing positions in the multilayer stack.
Figure 2B:
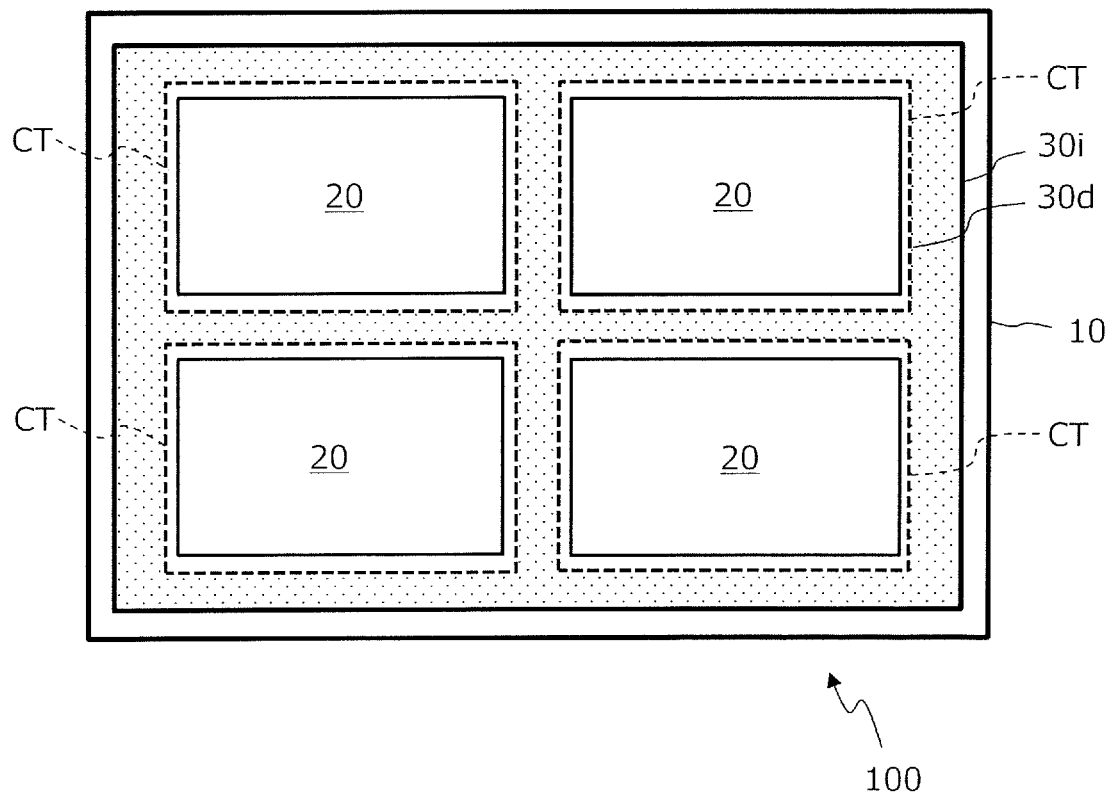
FIG. 2B is a plan view schematically showing the dividing positions in the multilayer stack.

FIGS. 2A and 2B are respectively a cross-sectional view and a plan view schematically showing the positions for dividing the intermediate region 30i and respective ones of the plurality of flexible substrate regions 30d of the plastic film 30 from one another. The positions of irradiation with laser beam for cutting extend along the periphery of each of the flexible substrate regions 30d. In FIGS. 2A and 2B, the irradiation positions (cutting positions) CT indicated by arrows or broken lines are irradiated with a laser beam for cutting. Part of the multilayer stack 100 exclusive of the glass base 10 is cut into a plurality of light-emitting devices (e.g., displays) 1000 and the remaining unnecessary portions. By cutting, a gap of several tens of micrometers to several hundreds of micrometers is formed between each of the light-emitting devices 1000 and a portion surrounding the light-emitting device 1000. The cutting can also be realized by a cutter which has a fixed blade or a rotary blade instead of the laser beam irradiation. After the cutting, the light-emitting devices 1000 and the remaining unnecessary portions are still bound to the glass base 10.

As shown in FIG. 2B, the planar layout of the "unnecessary portion" in the multilayer stack 100 accords with the planar layout of the intermediate region 30i of the plastic film 30. In the example illustrated in the drawing, this "unnecessary portion" is a single continuous sheet-like structure which has openings. However, the embodiment of the present disclosure is not limited to this example. The irradiation positions CT of the cutting laser beam may be set such that the "unnecessary portion" is divided into a plurality of portions. Note that the sheet-like structure, which is the "unnecessary portion", includes not only the intermediate region 30i of the plastic film 30 but also cut portions of stacked elements which are present above the intermediate region 30i (e.g., the gas barrier film 40 and the protection sheet 50).

When the cutting is realized by a laser beam, the wavelength of the laser beam may be in any of the infrared, visible and ultraviolet bands. From the viewpoint of reducing the effect of the cutting on the glass base 10, the laser beam desirably has a wavelength in the range of green to ultraviolet. For example, when a Nd:YAG laser apparatus is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the glass base 10 can be cut (divided) into light-emitting devices and unnecessary portions without damaging the glass base 10.

According to the embodiment of the present disclosure, the timing of the above-described cutting is earlier than in the prior art. Since the cutting is carried out while the plastic film 30 is bound to the glass base 10, alignment for the cutting can be made with high precision and accuracy even if the gap between adjoining light-emitting devices 1000 is narrow. Thus, the gap between adjoining light-emitting devices 1000 can be shortened, and accordingly, useless portions which are unnecessary for a final product can be reduced. In the prior art, after the delaminating from the glass base 10, a polarizer, a heat radiation sheet, and/or an electromagnetic shield can be adhered to the plastic film 30 so as to cover the entirety of the surface (delaminated surface) of the plastic film 30. In such a case, the polarizer, the heat radiation sheet, and/or the electromagnetic shield are also divided by cutting into portions covering the light-emitting devices 1000 and the remaining unnecessary portions. The unnecessary portions are disposed of as waste. On the other hand, according to the production method of the present disclosure, production of such waste can be suppressed as will be described later.

<Lift-Off Light Irradiation>

After the intermediate region 30i and respective ones of the plurality of flexible substrate regions 30d of the plastic film 30 are divided from one another, the step of irradiating the interface between the flexible substrate regions 30d of the plastic film 30 and the glass base 10 with laser light is carried out using a delaminating apparatus.

Figure 3A:
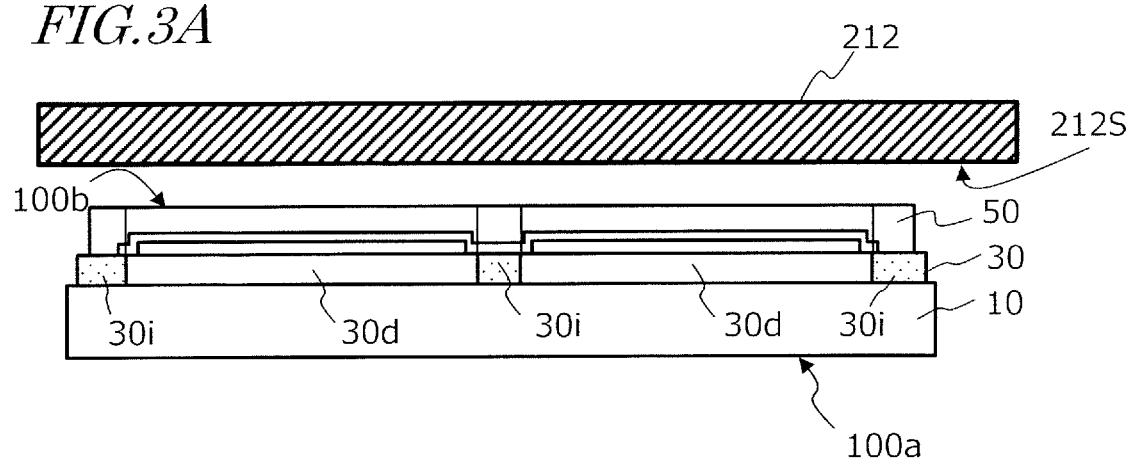
FIG. 3A is a diagram schematically showing a state immediately before a stage supports a multilayer stack.

FIG. 3A schematically shows a state in an unshown production apparatus (delaminating apparatus) immediately before the stage 212 supports the multilayer stack 100. In the present embodiment, the stage 212 is a chuck stage which has a large number of pores in the surface for suction. Details of the configuration of the chuck stage will be described later. The multilayer stack 100 is arranges such that the second surface 100b of the multilayer stack 100 faces the surface 212S of the stage 212, and is supported by the stage 212.

Figure 3B:
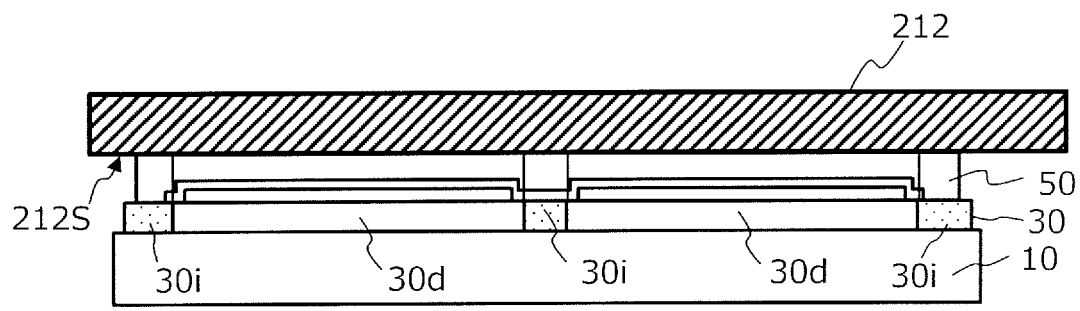
FIG. 3B is a diagram schematically showing a state where the stage supports the multilayer stack.

FIG. 3B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

In the example illustrated in FIG. 3B, the multilayer stack 100 is in contact with the surface 212S of the stage 212, and the stage 212 holds the multilayer stack 100 by suction.

Figure 3C:
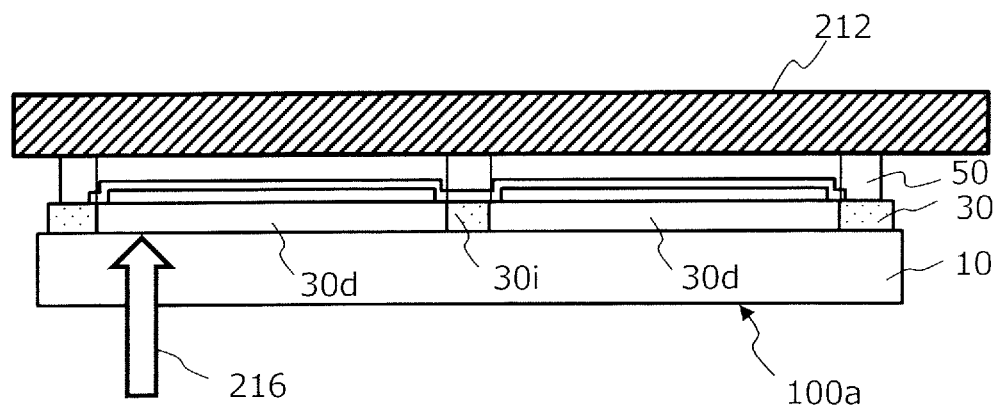
FIG. 3C is a diagram schematically showing that the interface between a glass base and a plastic film of the multilayer stack with lift-off light in the shape of a line.

Then, as shown in FIG. 3C, the interface between the plurality of flexible substrate regions 30d of the plastic film 30 and the glass base 10 is irradiated with lift-off light 216. FIG. 3C schematically illustrates irradiation of the interface between the glass base 10 and the plastic film 30 of the multilayer stack 100 with the lift-off light 216 in the shape of a line extending in a direction vertical to the sheet of the drawing. A part of the plastic film 30 at the interface between the glass base 10 and the plastic film 30 absorbs the lift-off light 216 and decomposes (disappears). By scanning the above-described interface with the lift-off light 216, the degree of binding of the plastic film 30 to the glass base 10 is reduced. The wavelength of the lift-off light 216 is typically in the ultraviolet band. The wavelength of the lift-off light 216 is selected such that the lift-off light 216 is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

Hereinafter, irradiation with lift-off light in the present embodiment will be described in detail.

<Lift-Off Light Irradiation Unit 1>

In the present embodiment, the delaminating apparatus includes a line beam source for emitting the lift-off light 216. The line beam source includes a laser apparatus and an optical system for shaping laser light emitted from the laser apparatus into a line beam.

Figure 4A:
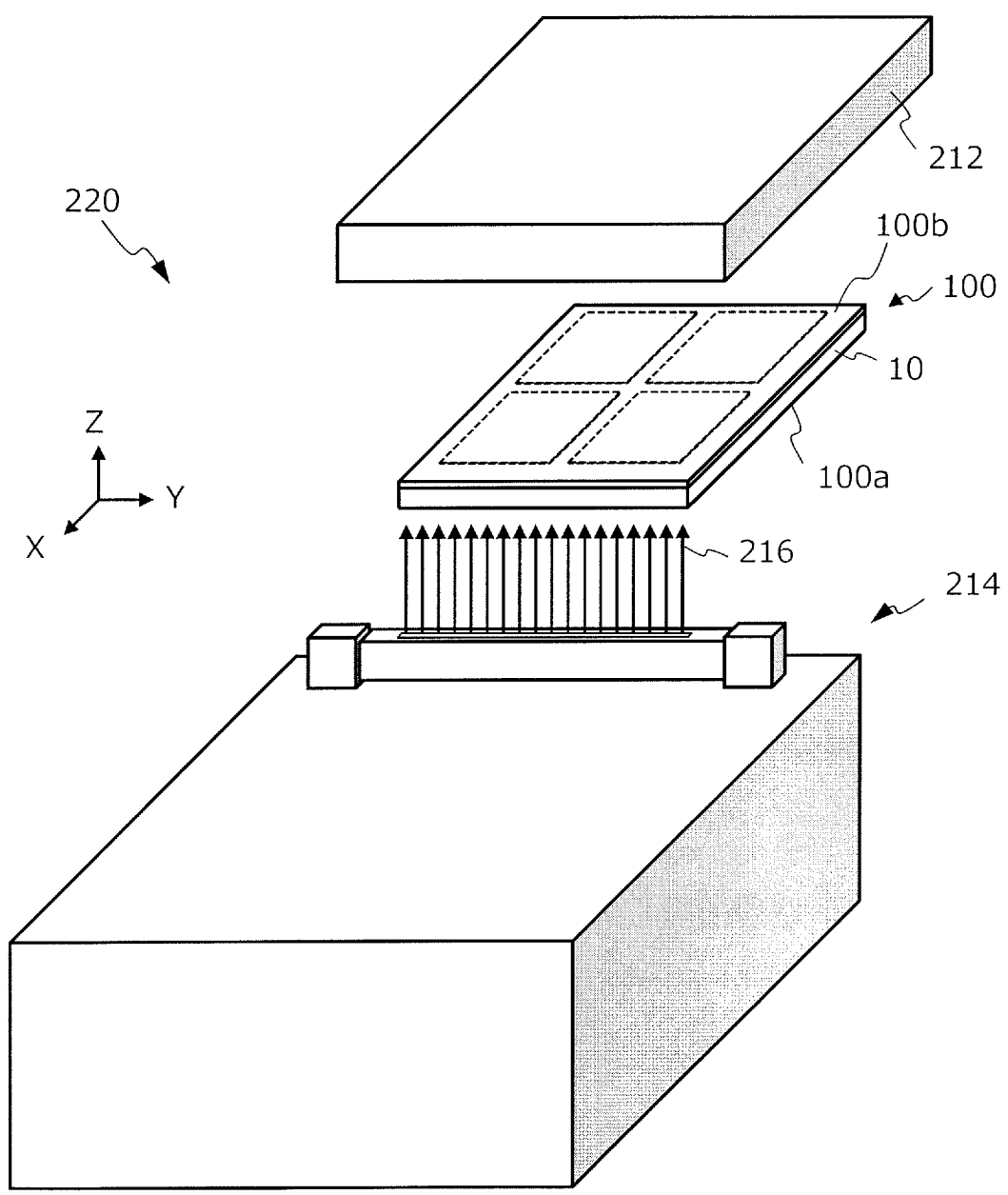
FIG. 4A is a perspective view schematically showing irradiation of the multilayer stack with a line beam emitted from a line beam source of a delaminating apparatus.

FIG. 4A is a perspective view schematically showing irradiation of the multilayer stack 100 with a line beam (lift-off light 216) emitted from a line beam source 214 of a delaminating apparatus 220. For the sake of understandability, the stage 212, the multilayer stack 100 and the line beam source 214 are shown as being spaced away from one another in the Z-axis direction of the drawing. During irradiation with the lift-off light 216, the second surface 100b of the multilayer stack 100 is in contact with the stage 212.

Figure 4B:
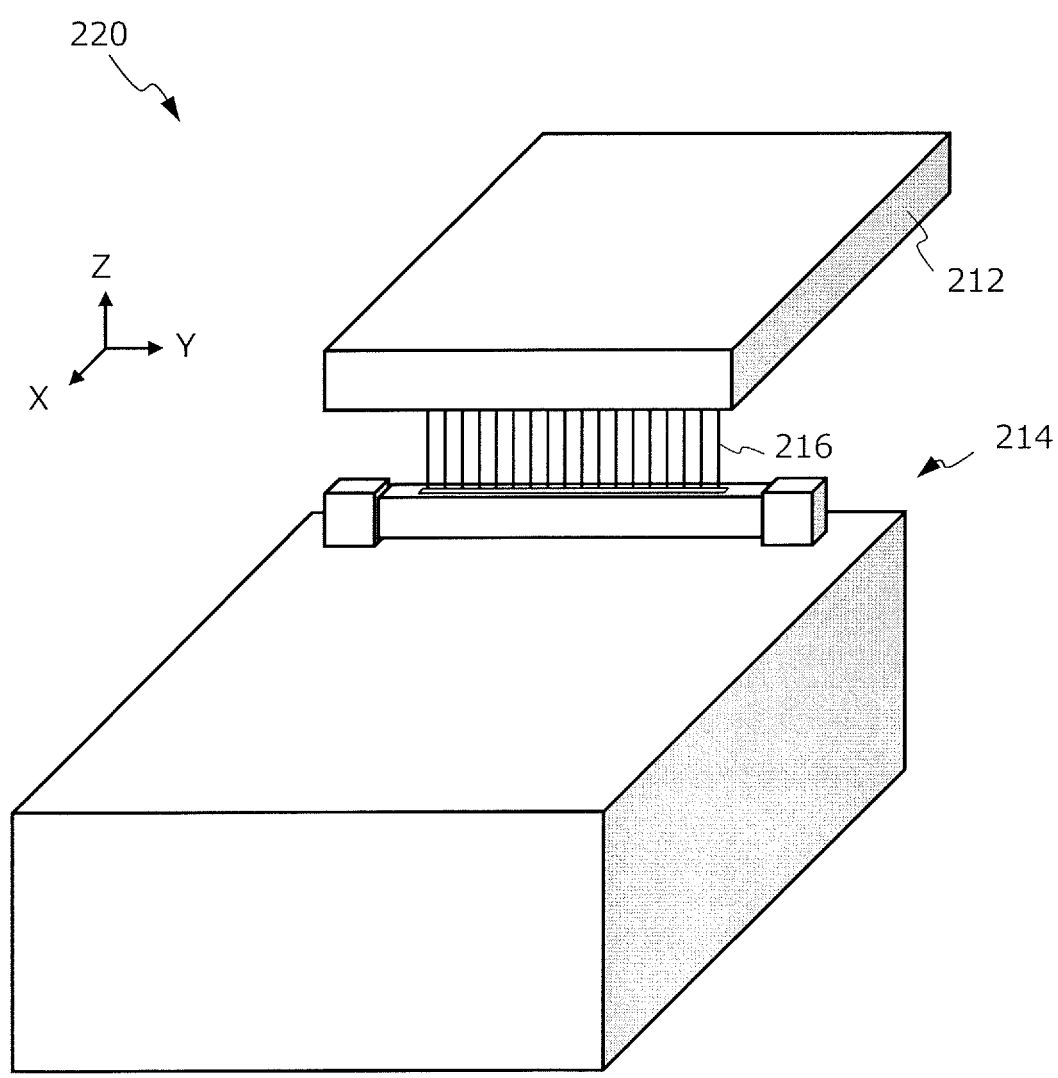
FIG. 4B is a diagram schematically showing the position of the stage at the start of irradiation with lift-off light.

FIG. 4B schematically shows the position of the stage 212 during irradiation with the lift-off light 216. Although not shown in FIG. 4B, the multilayer stack 100 is supported by the stage 212.

Examples of the laser apparatus that emits the lift-off light 216 include gas laser apparatuses such as excimer laser, solid state laser apparatuses such as YAG laser, semiconductor laser devices, and other types of laser apparatuses. A XeCl excimer laser apparatus can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used. Laser light in the shape of a spot beam emitted from these laser apparatuses is combined with an optical system consisting of lenses and prisms for reshaping the light into the shape of a line beam, whereby lift-off light 216 in the shape of a line beam is produced.

A sacrificial layer (a thin layer of a metal or amorphous silicon) may be provided at the interface between the plastic film 30 and the glass base 10. From the viewpoint of suppressing generation of ashes, using laser light at the wavelength of 308 nm from the excimer laser apparatus, rather than laser light at the wavelength of 340-360 nm, is more effective. Providing the sacrificial layer is highly effective in suppressing generation of ashes.

The irradiation with the lift-off light 216 can be carried out with the power density (irradiance) of, for example, 250-300 $mJ/cm^2$. The lift-off light 216 in the shape of a line beam has a size which can extend across the glass base 10, i.e., a line length which exceeds the length of one side of the glass base (long axis dimension, size in Y-axis direction of FIG. 4B). The line length can be, for example, not less than 750 mm. Note that, however, if the line length of a line beam to be produced is 1 m or more, the optical system for reshaping the laser light is too big to construct and, accordingly, deterioration of the quality (uniformity) of the line beam is inevitable. Thus, usually, the longest possible line beam has a length corresponding to the G6H substrate size (the shorter side of a 1800 mm×750 mm rectangle), i.e., a beam length up to about 750 mm. Meanwhile, the line width of the lift-off light 216 (short axis dimension, size in X-axis direction of FIG. 4B) can be, for example, about 0.2 mm. These dimensions represent the size of the irradiation region at the interface between the plastic film 30 and the glass base 10. The lift-off light 216 can be emitted in the form of a pulsed or continuous wave. Irradiation with the pulsed wave can be carried out at the frequency of, for example, about 200 times per seconds.

Figure 4C:
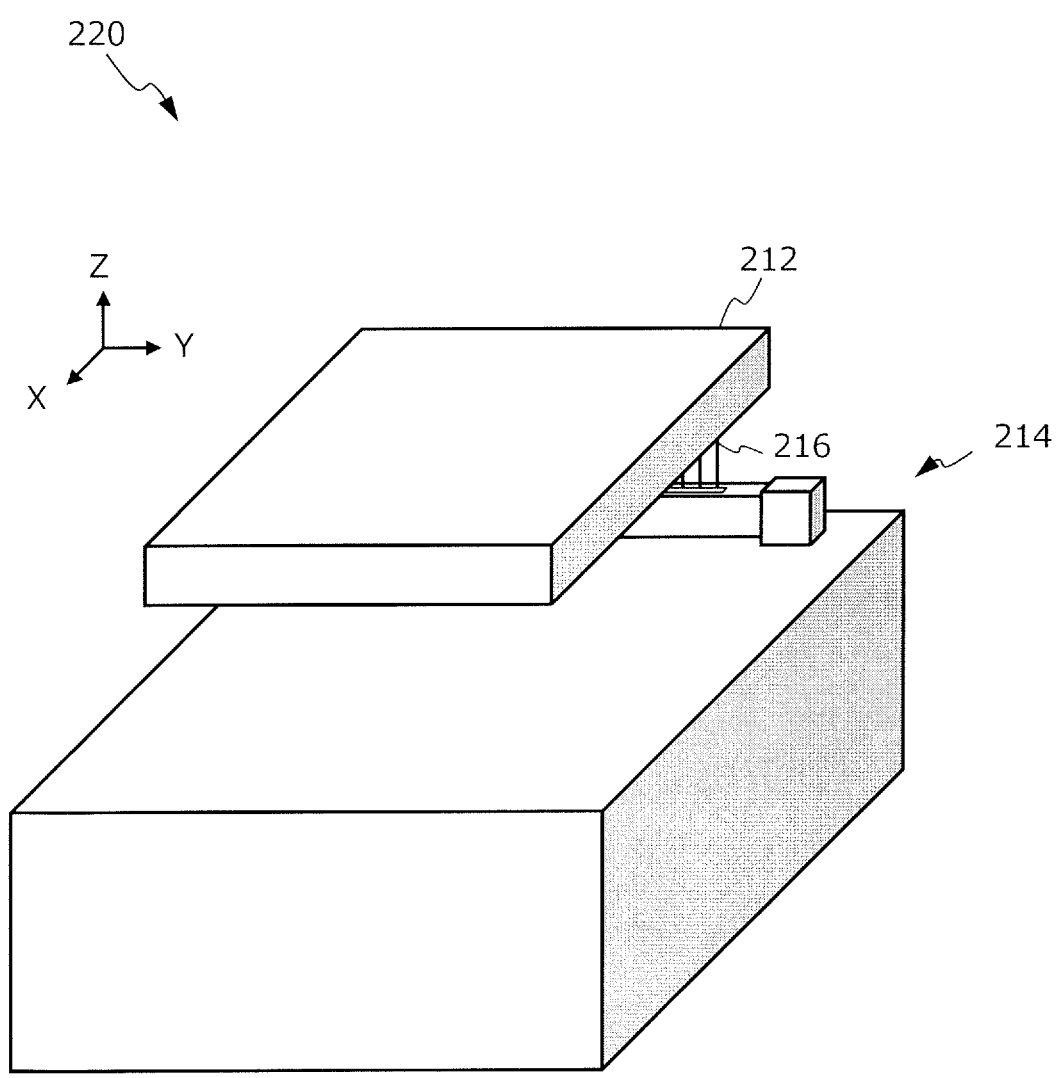
FIG. 4C is a diagram schematically showing the position of the stage at the end of irradiation with lift-off light.

The position of irradiation with the lift-off light 216 moves relative to the glass base 10 for scanning with the lift-off light 216. In the delaminating apparatus 220, the multilayer stack 100 may be movable while the light source 214 from which the lift-off light is to be emitted and an optical unit (not shown) are stationary, and vice versa. In the present embodiment, irradiation with the lift-off light 216 is carried out during a period where the stage 212 moves from the position shown in FIG. 4B to the position shown in FIG. 4C. That is, scanning with the lift-off light 216 is carried out by movement of the stage 212 in the X-axis direction.

<Lift-Off Light Irradiation Unit 2>

In the above-described embodiment, the light source included in the lift-off light irradiation unit is a laser light source, although the lift-off light irradiation unit of the present disclosure is not limited to this example. The lift-off light may be radiated from an incoherent light source instead of a coherent light source such as laser light source. In the example described in the following paragraphs, the interface between the plastic film and the glass base is irradiated with lift-off light radiated from an ultraviolet lamp.

Figure 23A:
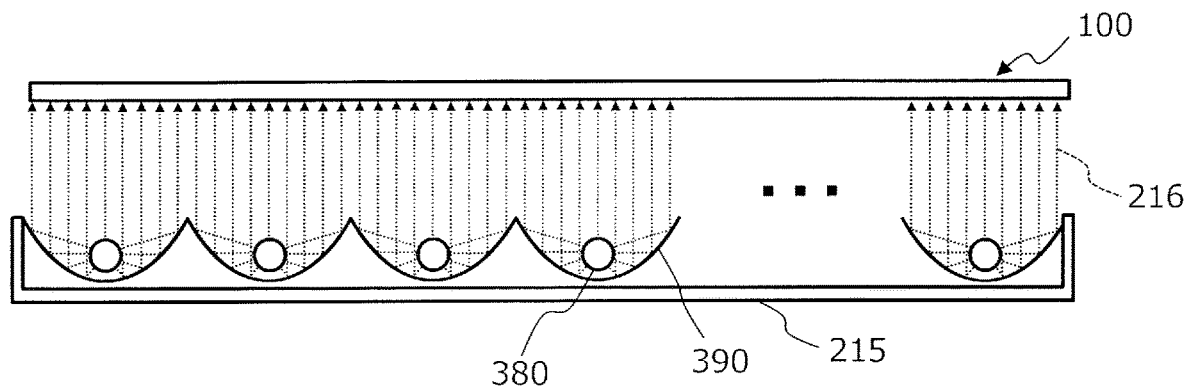
FIG. 23A is a cross-sectional view schematically showing a configuration example of a surface-emission light source 215 which is capable of radiating lift-off light 216.
Figure 23B:
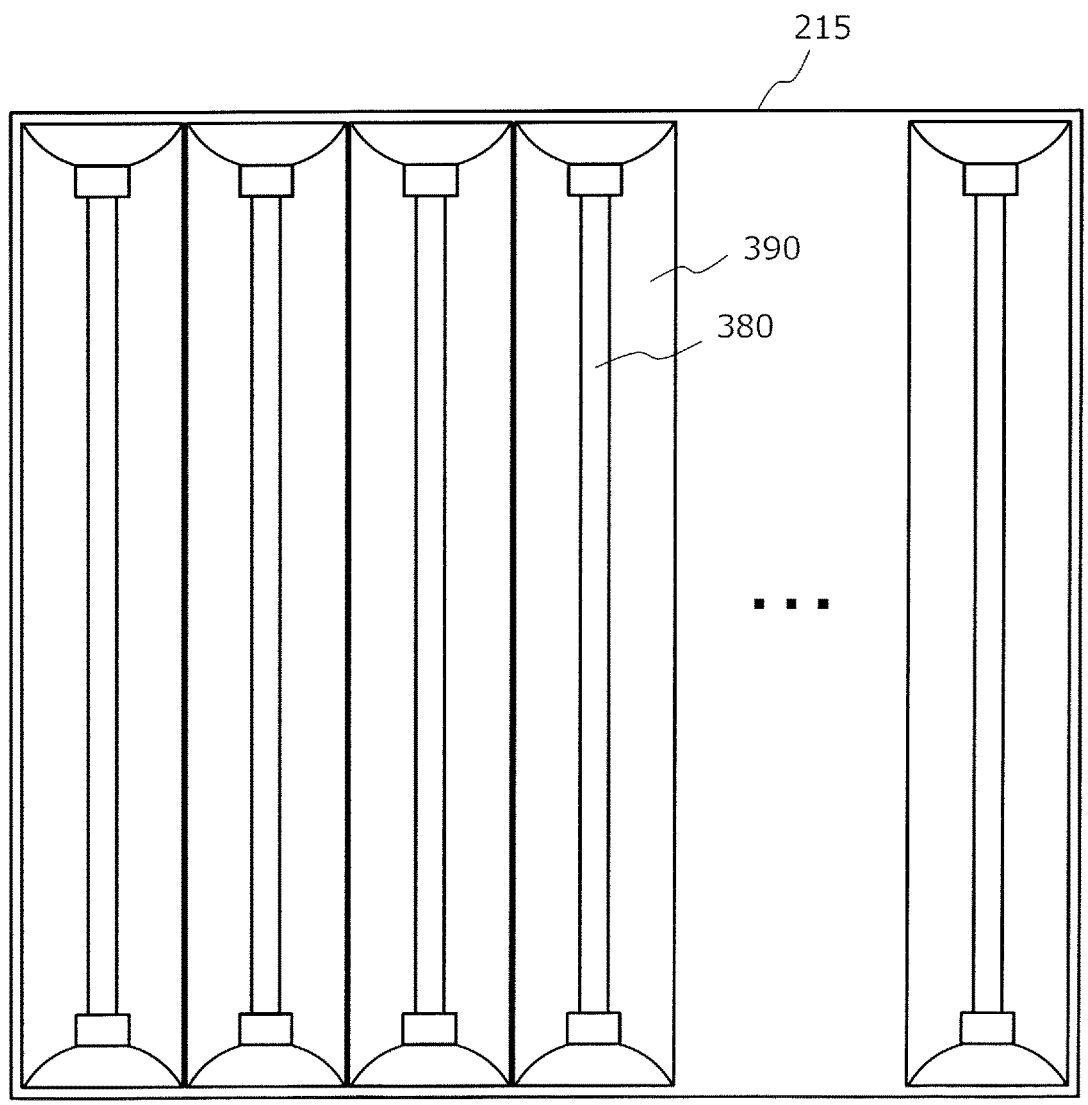
FIG. 23B is a top view schematically showing the configuration example of the surface-emission light source 215.

FIG. 23A is a cross-sectional view schematically showing a configuration example of a surface-emission light source 215 which is capable of radiating lift-off light 216. FIG. 23B is a top view schematically showing the configuration example of the surface-emission light source 215.

The surface-emission light source 215 shown in the drawings includes a plurality of ultraviolet lamps 380 arrayed in a region which is opposite to the multilayer stack 100 and a reflector 390 for reflecting ultraviolet light radiated from each of the ultraviolet lamps 380. The ultraviolet lamps 380 can be, for example, high-pressure mercury-vapor lamps which are capable of radiating i-line at 365 nm. In the example illustrated in the drawings, the reflector 390 reflects ultraviolet light radiated from the ultraviolet lamps 380 such that the reflected light can be substantially collimated light. When the reflector 390 is formed by a cold mirror, the infrared part of the light radiated from the high-pressure mercury-vapor lamps is prevented from reaching the multilayer stack 100. An infrared cut-off filter may be provided between the ultraviolet lamps 380 and the multilayer stack 100. By reducing or cutting off the infrared band which can be included in the lift-off light 216, the temperature increase of the multilayer stack 100 by infrared irradiation can be suppressed or prevented.

The irradiation energy of the lift-off light which is necessary for delamination of the plastic film 30 is in the range of, for example, not less than 100 mJ/cm$^2$ and not more than 300 mJ/cm$^2$. The light source such as the ultraviolet lamps 380 (incoherent light source) usually has a small irradiation intensity per unit area as compared with the previously-described laser light source. Therefore, a sufficient irradiation energy can be achieved by increasing the duration of lift-off light irradiation as compared with a case where a laser light source is used.

The surface-emission light source 215 shown in FIG. 23A and FIG. 23B can form lift-off light 216 which spreads in the shape of a plane. Therefore, the duration of the irradiation at respective positions can be increased as compared with scanning with a line beam.

In the example of FIG. 23A, the lift-off light 216 is collimated light formed by the reflector 390, although the embodiments of the present disclosure are not limited to this example. Light radiated from each of the ultraviolet lamps 380 may be converged using the reflector 390 and an unshown lens into the shape of a line whose width is about 1-3 mm. When the multilayer stack 100 is irradiated with the lift-off light 216 in the shape of such stripes, the entire surface of the multilayer stack 100 can be irradiated with the lift-off light 216 by shifting the relative position of the surface-emission light source 215 with respect to the multilayer stack 100.

When the irradiation intensity of the ultraviolet light radiated from the ultraviolet lamps 380 is high, the entire surface of the multilayer stack 100 can also be irradiated with the lift-off light 216 by scanning with the use of a single or several ultraviolet lamps 380. Even if the irradiation intensity of the ultraviolet light radiated from the ultraviolet lamps 380 is not high, reducing the scanning speed enables the entire surface of the multilayer stack 100 to be irradiated with the lift-off light 216 by scanning with the use of a single or several ultraviolet lamps 380. Note that, however, due to restrictions on the lamp length of the ultraviolet lamps 380, it is difficult to apply the ultraviolet lamps 380 to G8 substrates (2400 mm×2200 mm) or huge substrates of still larger sizes.

<Lift-Off Light Irradiation Unit 3>

In the example described in the following paragraphs, the interface between the plastic film and the glass base is irradiated with lift-off light radiated from an incoherent light source which includes a plurality of light emitting diode devices.

The light source used for radiating the lift-off light can be a plurality of light emitting diode (UV-LED) devices which are capable of radiating ultraviolet light. Each of such light emitting diode devices has the size of, for example, 3.5 mm (longitudinal)×3.5 mm (transverse)×1.2 mm (thickness). The plurality of light emitting diode devices can be arrayed in a single line or in a plurality of lines. As previously described, in reshaping laser light in the shape of a spot beam emitted from a conventional excimer laser or YAG laser into the shape of a line beam using an optical system including lenses and prisms, it is difficult to realize a line length of 1 m or more due to the production cost of the optical system and increase in nonuniformity of the line beam after the reshaping of the laser light. Even if the ultraviolet lamp is used, an unlimited line length cannot be realized because the lamp length of the ultraviolet lamp has a limit. However, when a plurality of light sources are arrayed which are capable of radiating ultraviolet light as in the present embodiment, the line length of the lift-off light in the shape of a line beam can easily be 1 m or more, and the irradiation unit is applicable to G8-size substrates (2400 mm×2200 mm) or huge substrates of still larger sizes.

Figure 24:
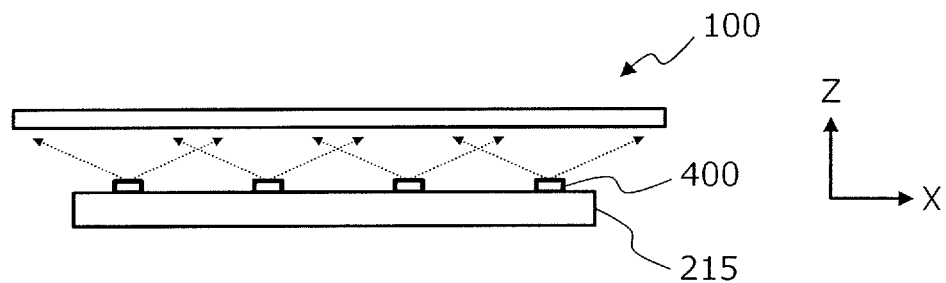
FIG. 24 is a cross-sectional view schematically showing a surface-emission light source 215 which includes a plurality of light emitting diode devices 400 that are two-dimensionally arrayed.

FIG. 24 is a cross-sectional view schematically showing a surface-emission light source 215 which includes a plurality of light emitting diode devices 400 that are two-dimensionally arrayed. Light radiated from each of the light emitting diode devices 400 diverges around the Z-axis direction at the center. This light represents the distribution (directivity) of the relative radiation intensity which depends on the radiation angle θ that is the gradient from the Z-axis.

In one example, the relative radiation intensity of the light emitting diode devices can be about 75% at θ=45°, and about 50% at θ=65°. The directivity of the light emitting diode devices can be adjusted by providing a lens and/or reflector. Also in this case, by two-dimensionally arraying a large number of light emitting diode devices 400, the irradiation unit is applicable to huge substrates although it is impossible in a conventional light source (a combination of a laser light source and an optical system, or an ultraviolet lamp).

Commercially-available light emitting diode devices are capable of radiating ultraviolet light at 365 nm with the power of 1450 milliwatts on the driving conditions that, for example, the electric voltage is 3.85 volts and the electric current is 1000 milliamperes.

Figure 25:
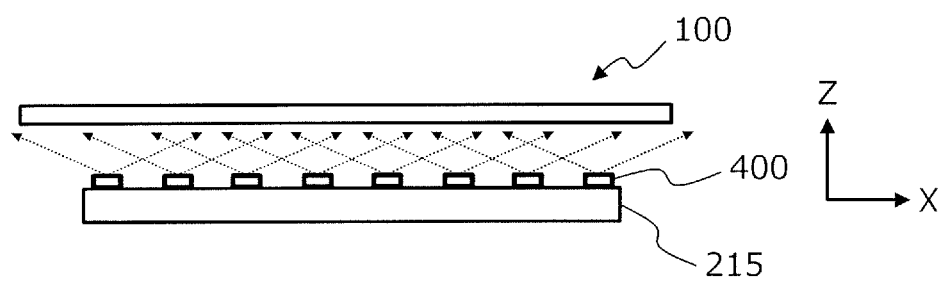
FIG. 25 is a cross-sectional view showing a surface-emission light source 215 in which the in-plane number density of the light emitting diode devices 400 is high as compared with the example shown in FIG. 24.

FIG. 25 is a cross-sectional view showing a surface-emission light source 215 in which the in-plane number density of the light emitting diode devices 400 is high as compared with the example shown in FIG. 24. As the in-plane number density of the light emitting diode devices 400 increases, the irradiation intensity can increase.

Figure 26:
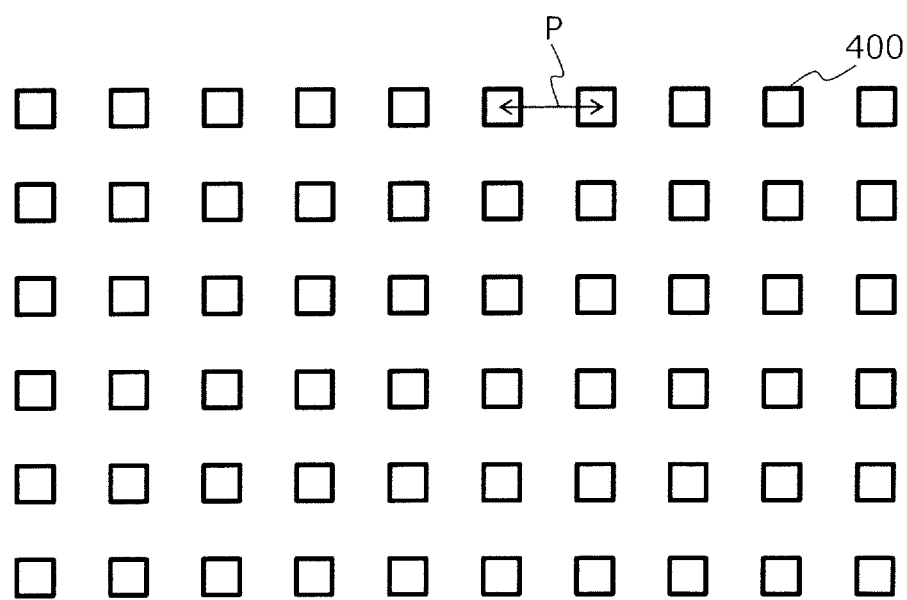
FIG. 26 is a diagram showing an array of light emitting diode devices 400 arrayed in rows and columns.

FIG. 26 is a diagram showing an array of light emitting diode devices 400 arrayed in rows and columns. The interval (array pitch) P between adjoining light emitting diode devices 400 is selected such that the irradiation intensity exceeds a level necessary for delamination across the entirety of the interface between the plastic film and the glass base.

<Lift-Off Light Irradiation Unit 4>

The emission intensity of the light emitting diode device is controlled by adjusting the magnitude of the driving current. Therefore, in a one-dimensional or two-dimensional array of light emitting diode devices, by modulating the driving current flowing through each of the light emitting diode devices, the irradiation intensity of the lift-off light can be temporally and/or spatially modulated.

The array pitch of the light emitting diode devices is in the range of, for example, not less than 3 mm and not more than 10 mm. The light radiated from the light emitting diode devices is incoherent (non-coherent) light, which is different from laser light. The wavelength of the light radiated from the light emitting diode devices is in the range of, for example, not less than 300 nm and not more than 380 nm.

An example of a line beam light source in which a plurality of light emitting diode devices are arrayed is described with reference to FIG. 27A, FIG. 27B and FIG. 27C.

Figure 27A:
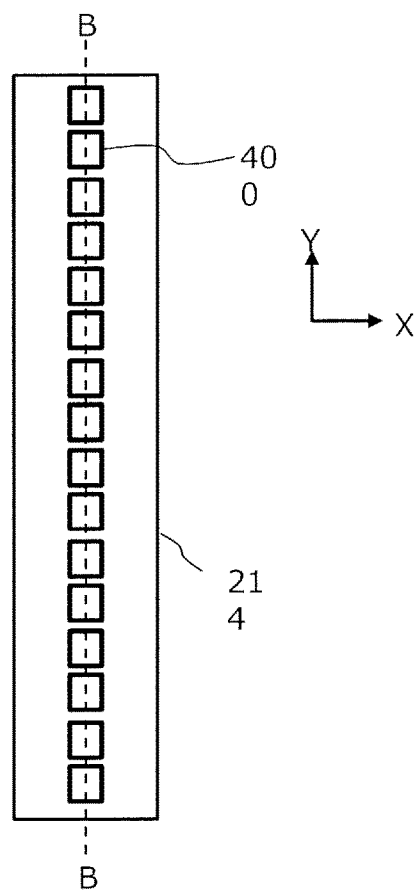
FIG. 27A is a diagram schematically showing the upper surface of a line beam light source 214 which includes a single column of light emitting diode devices arrayed in Y-axis direction.
Figure 27B:
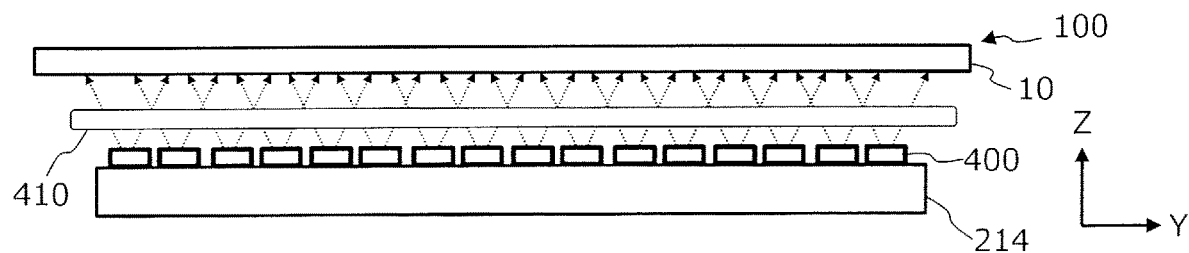
FIG. 27B is a cross-sectional view of a multilayer stack shown in FIG. 27A taken along line B-B.

FIG. 27A schematically shows the upper surface of a line beam light source 214 which includes a plurality of light emitting diode devices 400 arrayed in Y-axis direction. FIG. 27B is a cross-sectional view of the line beam light source 214 shown in FIG. 27A taken along line B-B. FIG. 27B also shows a multilayer stack 100. FIG. 27C is a diagram showing the moving direction of the line beam light source 214 relative to the multilayer stack 100.

In this example, the ultraviolet light radiated from the light emitting diode devices 400 travels through a cylindrical lens 410 and enters the glass base 10 of the multilayer stack 100 in order to increase the irradiation energy per unit area (irradiation intensity expressed in joule/cm$^2$). Since the ultraviolet light is focused in X-axis direction, the width (the size in X-axis direction) of the irradiation region in the interface at which delamination is to occur (delamination plane) can be decreased to, for example, about 0.2 mm or smaller. Since the cylindrical lens 410 does not focus the light in X-axis direction, the size in Y-axis direction of the irradiation region is not shortened.

The irradiation intensity of the lift-off light can be increased by decreasing the array pitch of the light emitting diode devices 400 such that the number density of the light emitting diode devices 400 increases. For example, when each of the light emitting diode devices 400 has the above-described size, several tens of light emitting diode devices 400 or 100 or more light emitting diode devices 400 may be arrayed with the intervals of 3.5 mm to 10 mm (array pitch: the distance between the centers of adjoining light sources). When smaller light emitting diode devices 400 are used, they can be arrayed with the intervals of, for example, 2.0 mm to 10 mm. The array pitch of the light emitting diode devices 400 is preferably not more than 5 mm.

Figure 27C:
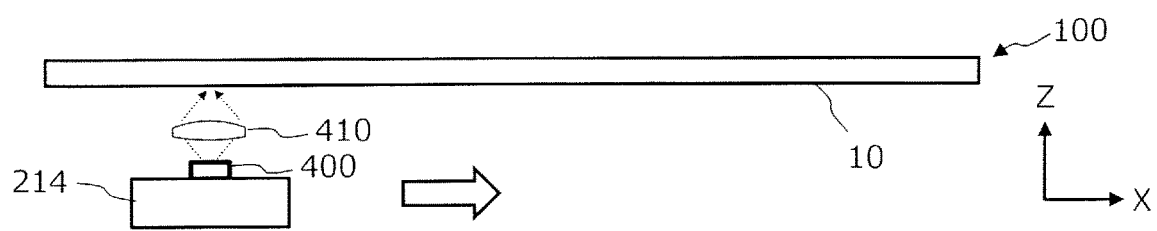
FIG. 27C is a diagram showing the moving direction of the line beam light source relative to the multilayer stack.

By moving the line beam light source 214 relative to the multilayer stack 100 as shown in FIG. 27C, the entire surface of the multilayer stack 100 can be irradiated with the lift-off light.

To increase the irradiation intensity of the line beam light source 214, the light emitting diode devices 400 may be arrayed in a plurality of columns.

Figure 28A:
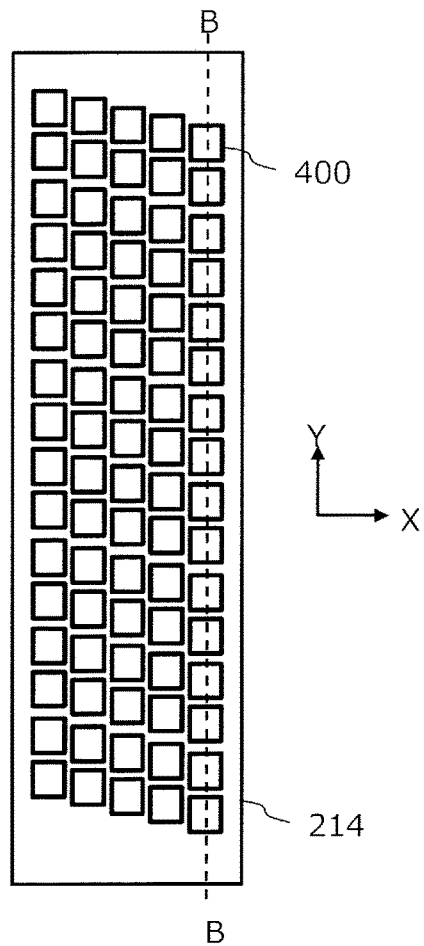
FIG. 28A is a diagram schematically showing the upper surface of a line beam light source 214 which includes a plurality of columns of light emitting diode devices arrayed in Y-axis direction.
Figure 28B:
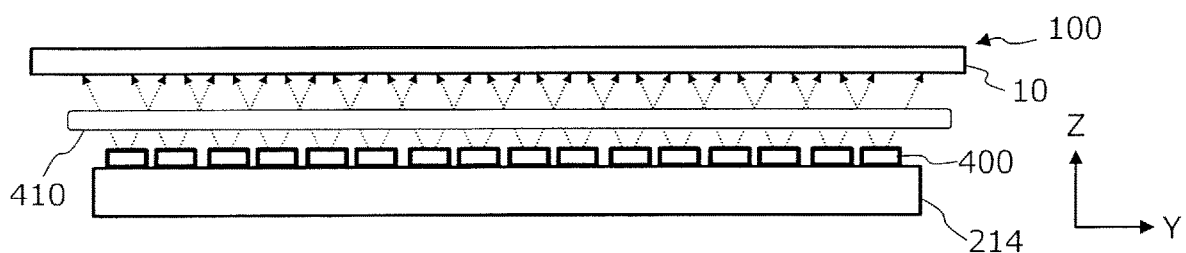
FIG. 28B is a cross-sectional view of the line beam light source shown in FIG. 28A taken along line B-B.
Figure 28C:
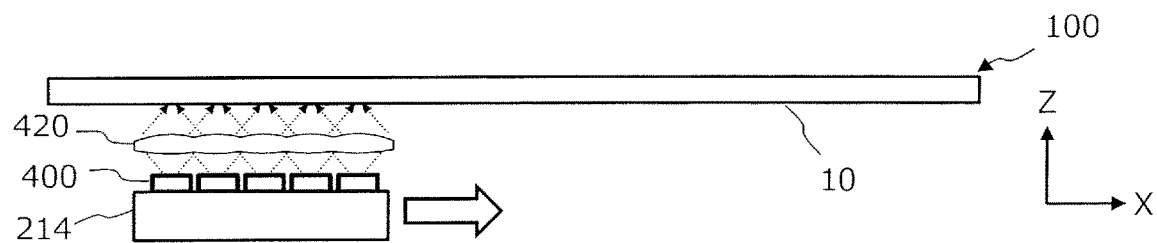
FIG. 28C is a diagram showing the moving direction of the line beam light source relative to the multilayer stack.

FIG. 28A schematically shows the upper surface of the line beam light source 214 which includes a plurality of columns of light emitting diode devices 400 arrayed in Y-axis direction. FIG. 28B is a cross-sectional view of the line beam light source 214 shown in FIG. 28A taken along line B-B. FIG. 28B also shows the multilayer stack 100. FIG. 28C is a diagram showing the moving direction of the line beam light source 214 relative to the multilayer stack 100.

In this example, the line beam light source 214 includes five columns of light emitting diode devices 400 each extending in Y-axis direction. The positions in Y-axis direction of the five columns of light emitting diode devices 400 are different from one another. The positions of the light emitting diode columns are shifted by P/5 in Y-axis direction between adjoining columns where P is the array pitch. By moving the line beam light source 214 relative to the multilayer stack 100 as shown in FIG. 28C, the entire surface of the multilayer stack 100 can be irradiated with the lift-off light.

The irradiation with the lift-off light may be carried out while the plurality of light sources are kept stationary relative to the multilayer stack 100.

Figure 29:
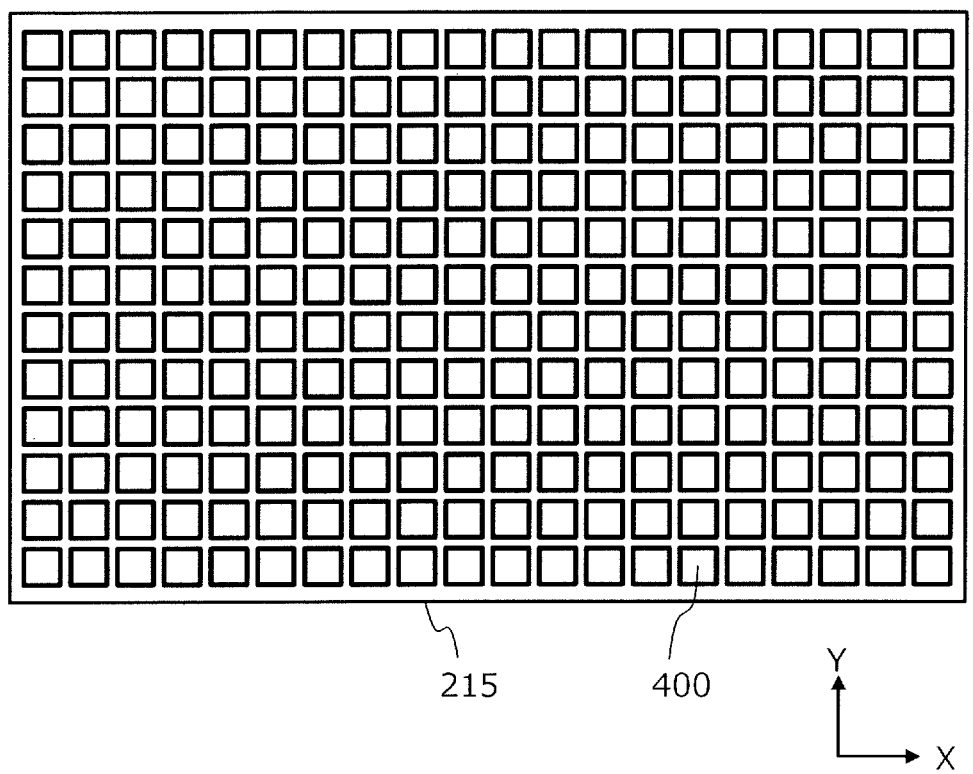
FIG. 29 is a top view schematically showing an example of a surface-emission light source in which a large number of light emitting diode devices are arrayed in a matrix.

FIG. 29 is a top view schematically showing an example of a surface-emission light source 215 in which a large number of light emitting diode devices 400 are arrayed in a matrix. The number of light emitting diodes arrayed vertically and horizontally only needs to be arbitrarily set according to the size of the substrate used. In this case, a delaminating apparatus applicable to G8-size substrates or huge substrates of still larger sizes can be realized. The plane to be delaminated may be divided into a plurality of regions, and each of the regions may be irradiated with a flash of the lift-off light in the same way as sequential exposure with the use of a stepper.

When the irradiation with the lift-off light is carried out while both the multilayer stack 100 and the surface-emission light source 215 are kept stationary, a precise driving unit for light scanning is not necessary. When the irradiation with the lift-off light is carried out while the multilayer stack 100 is moved relative to a stationary line beam light source (FIG. 4A through FIG. 4C), an area which is at least twice the area of the multilayer stack 100 is necessary for the movement of the multilayer stack 100. However, when the surface-emission light source 215 is used, an extra area for the movement of the multilayer stack 100 is not necessary, and the area for installing the apparatus will advantageously be halved.

Thus, using light emitting diode devices enables irradiation with the lift-off light at a lower cost with the use of a large number of light sources rather than using semiconductor laser devices, which are relatively expensive. Further, the duration of radiation of the lift-off light from each of the light emitting diode devices can be easily increased. Therefore, even if the optical power of each of the light emitting diode devices is small, the irradiation energy required for delamination can be achieved by adjusting the irradiation duration. Furthermore, since laser light is not used, it is also advantageous from the viewpoint of safety for human eyes (eye-safe), and designing and operation of the apparatus are easier.

<Lift-Off>

Figure 5A:
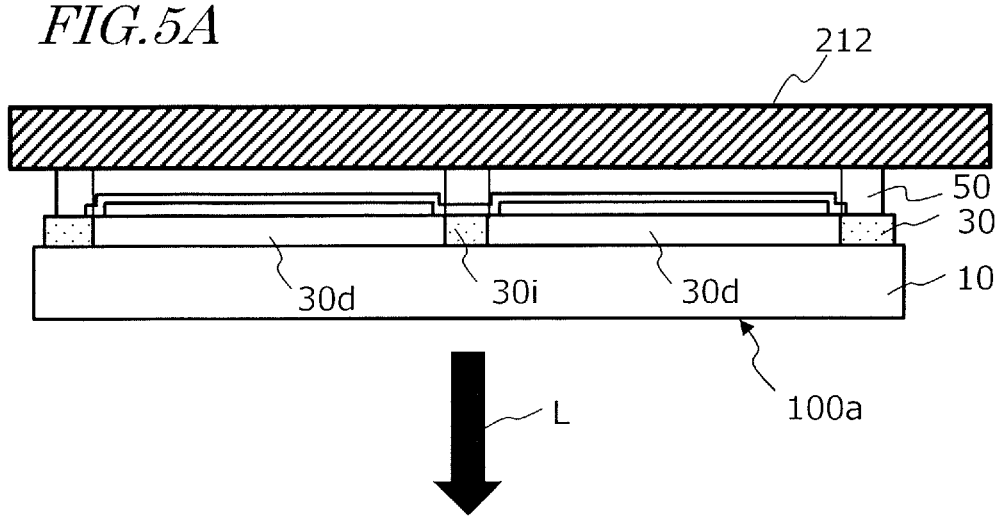
FIG. 5A is a cross-sectional view schematically showing the multilayer stack before the multilayer stack is separated into the first portion and the second portion after irradiation with lift-off light.

FIG. 5A illustrates a state where the multilayer stack 100 is in contact with the stage 212 after irradiation with the lift-off light. While this state is maintained, the distance from the stage 212 to the glass base 10 is increased. At this point in time, the stage 212 of the present embodiment holds a light-emitting device portion of the multilayer stack 100.

An unshown actuator holds the glass base 10 and moves the entirety of the glass base 10 in the direction of arrow L, thereby carrying out delaminating (lift-off). The glass base 10 can be moved together with an unshown chuck stage while being adhered by suction to the chuck stage. The direction of movement of the glass base 10 does not need to be vertical, but may be diagonal, to the first surface 100a of the multilayer stack 100. The movement of the glass base does not need to be linear but may be rotational. Alternatively, the stage 212 may be moved upward in the drawing while the glass base 10 is secured by an unshown holder or another stage.

Figure 5B:
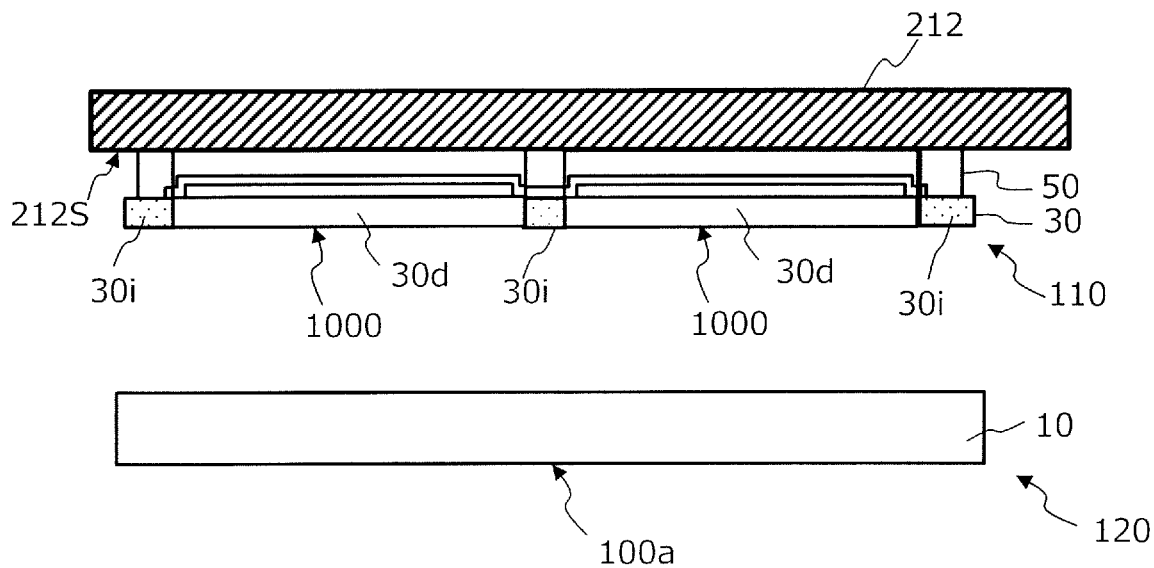
FIG. 5B is a cross-sectional view schematically showing the multilayer stack separated into the first portion and the second portion.

FIG. 5B is a cross-sectional view showing the thus-separated first portion 110 and second portion 120 of the multilayer stack 100. The first portion 110 of the multilayer stack 100 includes a plurality of light-emitting devices 1000 which are in contact with the stage 212. The respective light-emitting devices 1000 include the functional layer regions 20 and the plurality of flexible substrate regions 30d of the plastic film 30. Meanwhile, the second portion 120 of the multilayer stack 100 includes the glass base 10 and the intermediate region 30i of the plastic film 30.

Figure 5C:
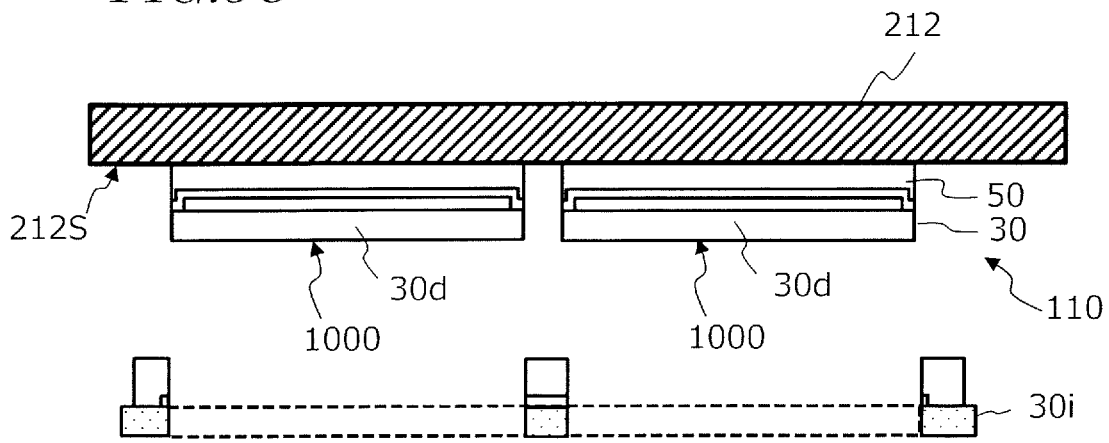
FIG. 5C is a cross-sectional view showing the stage from which the intermediate region of the plastic film has been delaminated.

FIG. 5C is a cross-sectional view showing the stage 212 from which the intermediate region 30i of the plastic film 30 has been delaminated. The respective light-emitting devices 1000 are kept in contact with the stage 212.

Configuration Example 1 of Stage

Figure 6A:
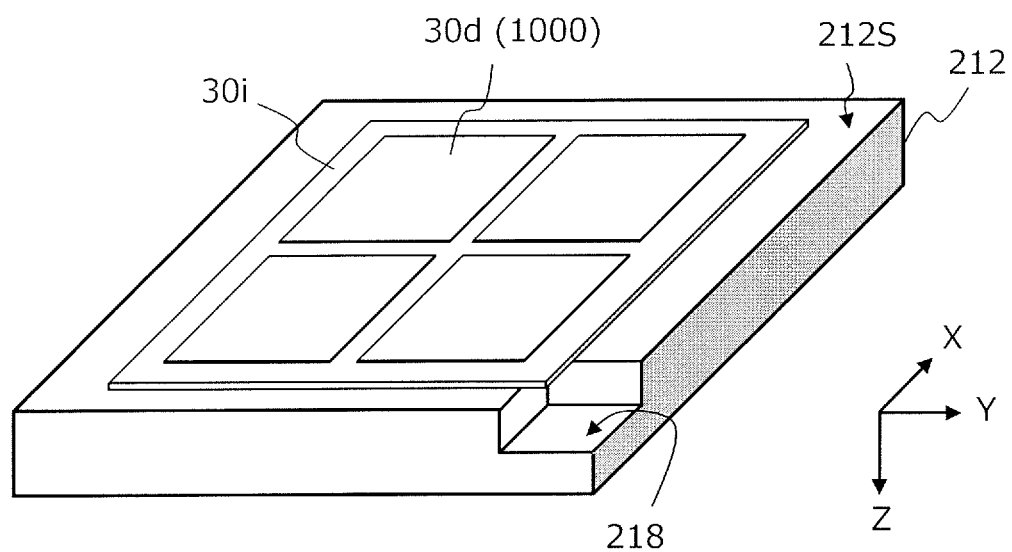
FIG. 6A is a perspective view showing a configuration example of a stage which can be used in an embodiment of the present disclosure.
Figure 6B:
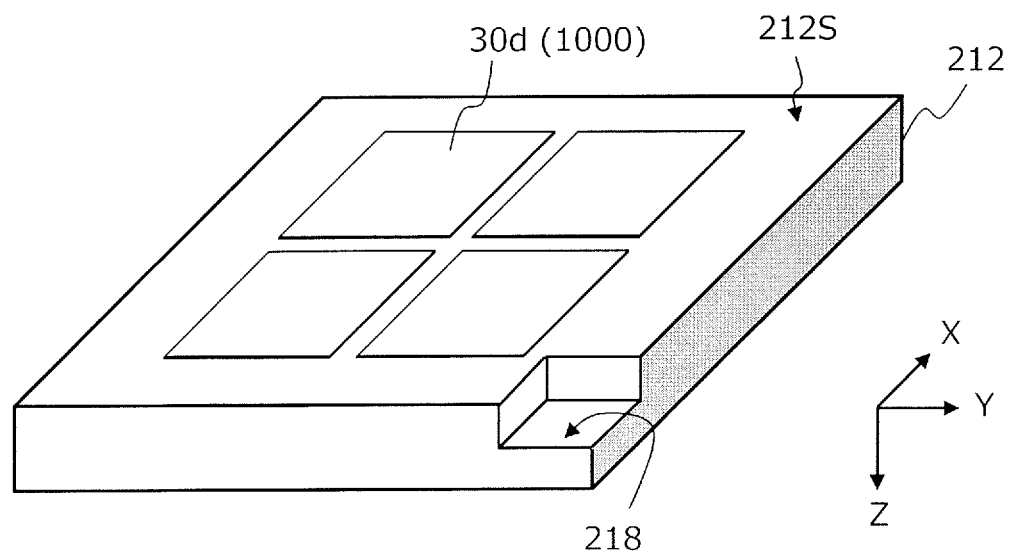
FIG. 6B is another perspective view showing a configuration example of a stage which can be used in an embodiment of the present disclosure.

FIG. 6A and FIG. 6B are perspective views showing configuration examples of the stage 212 which can be used in an embodiment of the present disclosure. FIG. 6A shows the intermediate region 30i of the plastic film 30 which is in contact with the stage 212. FIG. 6B shows the stage 212 from which the intermediate region 30i of the plastic film 30 has been removed.

The stage 212 shown in the drawings has a recess 218 which allows holding of the intermediate region 30i of the plastic film 30. In this example, the recess 218 is a cutout at an apex of the stage 212. Providing such a recess 218 in the stage 212 realizes a state where an unnecessary portion of the multilayer stack 100 (a portion exclusive of the light-emitting devices) is not in contact with the surface 212S of the stage 212. Therefore, a part of the intermediate region 30i of the plastic film 30 can be held by human fingers, a jig, a robot arm, or the like, for transporting the intermediate region 30i in the negative direction of the Z-axis, so that the entirety of the unnecessary portion (a portion exclusive of the light-emitting devices) can be removed from the stage 212.

After the entirety of the unnecessary portion of the first portion 110 of the multilayer stack 100 (a portion exclusive of the light-emitting devices) is thus removed from the stage 212, only the light-emitting devices 1000 are in contact with the stage 212. Since only the light-emitting devices 1000 that are constituents of final products are supported on the stage 212, various processes (e.g., mounting of parts) can be performed on the light-emitting devices 1000 that are in contact with the stage 212 without waste. Details of the processes will be described later.

In the example illustrated in the drawings, the stage 212 has a single recess 218, although the stage 212 may have a plurality of recesses 218. The position of the recess 218 is not limited to the four corners of the stage 212. The shape of the recess 218 does not need to be defined by rectangular planes but may be defined by curved or irregular surfaces. Providing a recess 218 of various shapes, such as round hole, through hole, slit, or the like, facilitates removal of the unnecessary portion included in the first portion 110 of the multilayer stack 100 from the stage 212.

As previously described with reference to FIG. 2B, the "unnecessary portion" can consist of a plurality of portions according to the irradiation position CT of the cutting laser beam. When the "unnecessary portion" consists of a plurality of portions, the stage 212 can have one or a plurality of recesses 218 such that each of the portions can be held. A groove-like recess may be formed in the stage 212 along the perimeter of the multilayer stack 100 so as to extend across a plurality of portions that form the "unnecessary portion".

Further, as will be described later, in a region of the surface 212S of the stage 212 which is in contact with the unnecessary portion included in the first portion 110 of the multilayer stack 100, the suction may be locally reduced or delamination may be enhanced. Such a feature may be combined with the recess 218.

In the above-described example, both the irradiation process with the lift-off light and the delaminating process are carried out using the delaminating apparatus 220 that includes the stage 212. The embodiment of the present disclosure is not limited to this example. The irradiation process with the lift-off light may be carried out using a lift-off light irradiation unit which includes a stage other than the stage 212, while the delaminating process is carried out using the delaminating apparatus that includes the stage 212. In this case, after irradiation with the lift-off light, it is necessary to transfer the multilayer stack 100 from the stage of the irradiation unit to the stage 212. When the same stage is used for carrying out both the irradiation process with the lift-off light and the delaminating process, the step of transferring the multilayer stack between the stages can be omitted.

Configuration Example 2 of Stage

Figure 7:
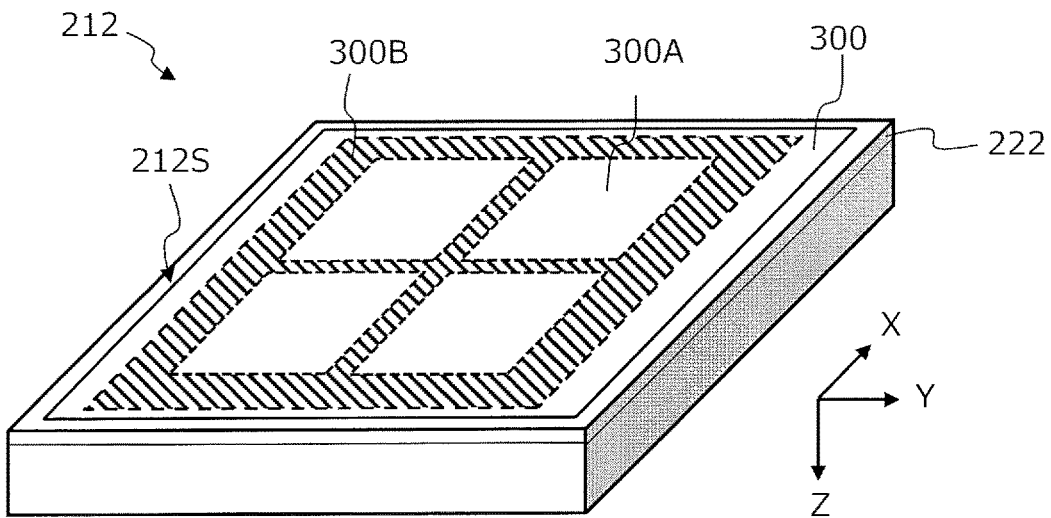
FIG. 7 is a perspective view schematically showing a surface of the stage.
Figure 8:
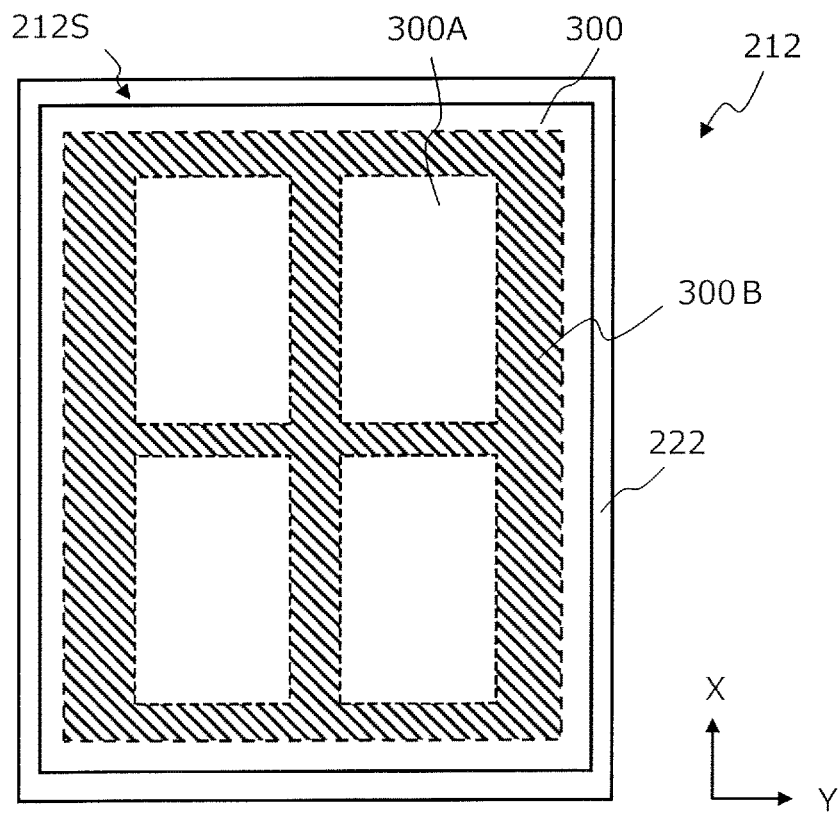
FIG. 8 is a plan view schematically showing the surface of the stage.

FIG. 7 is a perspective view schematically showing a surface of the stage 212 which has an alternative configuration. FIG. 8 is a plan view schematically showing the surface of the stage 212 of FIG. 7. For the sake of simplicity, the recess 218 of FIG. 6B is not shown. The recess 218 is not an indispensable feature in each of the stages. 212 which will be described below.

In this example, the stage 212 includes a suction sheet 300 provided on a porous front plate 222. A surface of the stage 212 shown in the drawings includes a plurality of first regions 300A which are to respectively face a plurality of light-emitting devices 1000 (not shown) and a second region 300B which is to face the intermediate region 30i of the plastic film 30. The suction in the first regions 300A is greater than the suction in the second region 300B.

Figure 9A:
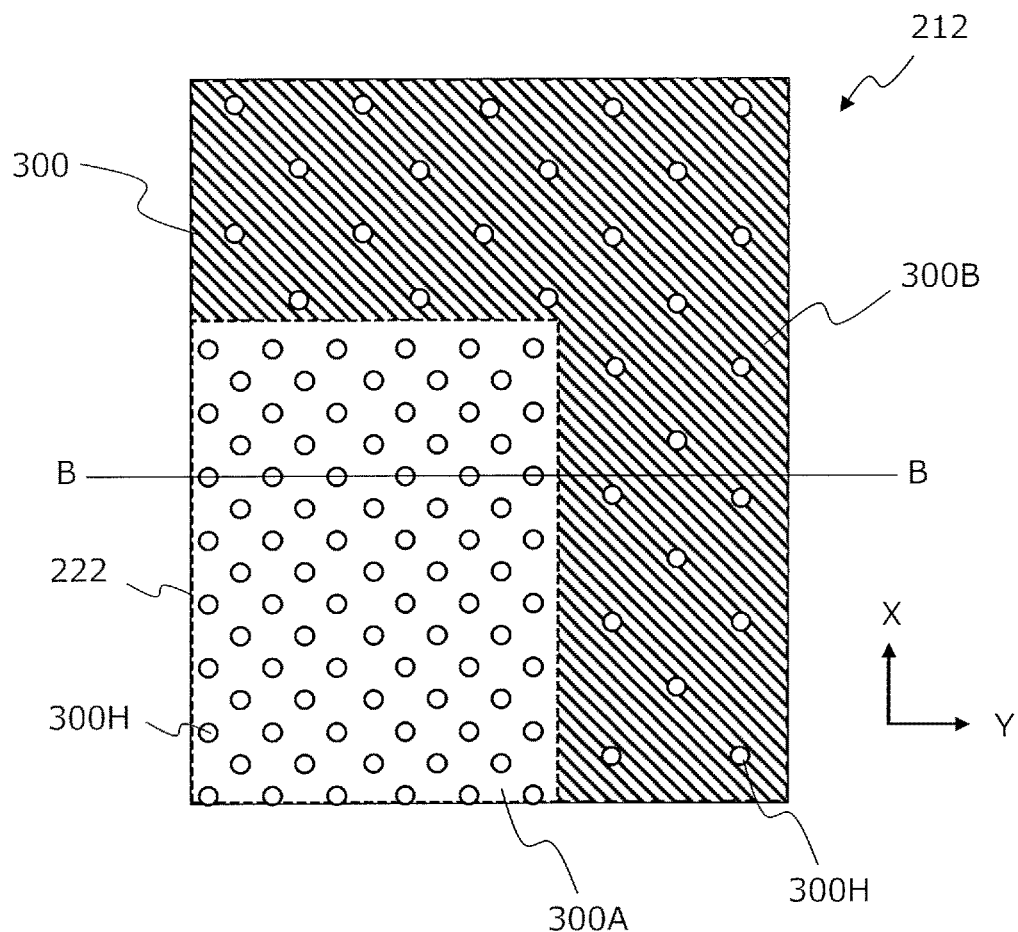
FIG. 9A is a schematic diagram enlargedly showing a portion in the vicinity of the boundary between a first region and a second region of the surface in a configuration example of the stage.
Figure 9B:
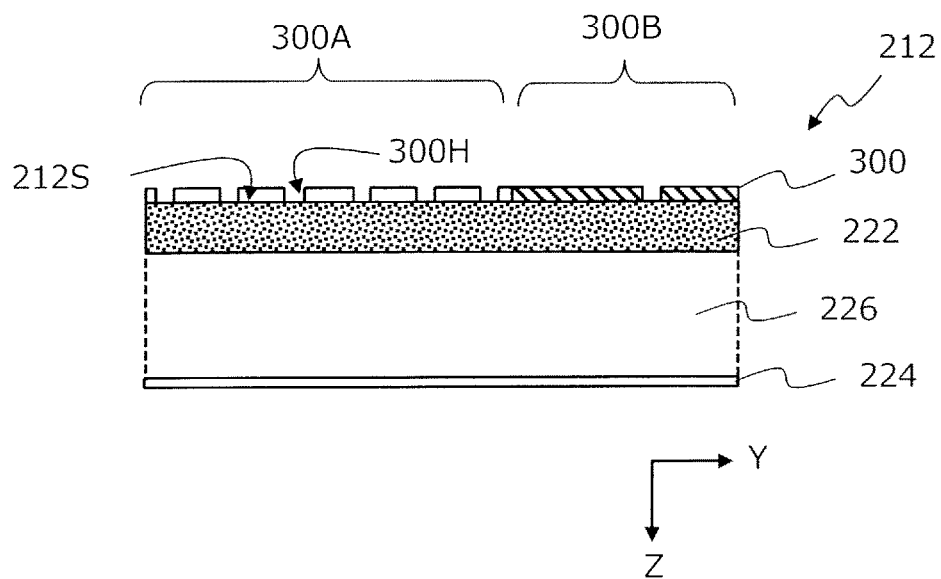
FIG. 9B is a cross-sectional view taken along line B-B of FIG. 9A.

FIG. 9A is a schematic diagram enlargedly showing a portion in the vicinity of the boundary between the first region 300A and the second region 300B. FIG. 9B is a cross-sectional view taken along line B-B of FIG. 9A. In this example, as shown in FIG. 9B, the stage 212 includes a porous front plate 222, a rear plate 224 which is parallel to the front plate 222, a space 226 formed between these plates, and a suction sheet 300 placed on the front plate 222. The space 226 is connected with a suction unit (not shown), such as a pump. During operation, the suction unit makes the space 226 have a negative pressure, so that external air flows into the space 226 via a large number of voids of the porous front plate 222 and openings (through holes 300H) of the suction sheet 300. Therefore, an object which is in contact with the suction sheet 300 is sucked by the stage 212 and hence adhered by suction to the stage 212.

The porous front plate 222 can be made of various porous materials. The porosity of the porous material is in the range of, for example, not less than 20% and not more than 60%. The average pore diameter is in the range of, for example, not less than 5 µm and not more than 600 µm. An example of the porous material is a sintered metallic or ceramic mass or a resin. The thickness of the porous material in the front plate 222 is in the range of, for example, not less than 1 mm and not more than 50 mm.

The suction sheet 300 has a plurality of through holes 300H as shown in FIG. 9A and FIG. 9B. The aperture ratio of the through holes 300H is different between the first region 300A which is in contact with the light-emitting device 1000 and the second region 300B which is to face the intermediate region 30i of the plastic film 30. The "aperture ratio" of the suction sheet 300 refers to the area proportion of a region (opening) in which the porous front plate 222 is exposed such that the suction function can be performed in the surface of the stage 212.

The suction sheet 300 can be made of various materials such as, for example, PET (polyethylene terephthalate), PVC (polyvinyl chloride), PP (polypropylene), fluoric resins (e.g., Polyflon), polyimide (PI), PC (polycarbonate), ABS resins. Alternatively, the suction sheet 300 may be made of woven fabric, nonwoven fabric, a porous film, or the like. The thickness of the suction sheet 300 can be, for example, about 0.05-3.0 mm.

The surface of the porous front plate 222 can achieve generally uniform sucking force. When the suction sheet 300 is placed, the suction differs between the first region 300A and the second region 300B. A region of the surface of the front plate 222 which is covered with unopened portions of the suction sheet 300 is incapable of sucking air and hence does not create suction. The suction sheet 300 can be used while it is adhered by suction to the porous front plate 222. The method of securing the suction sheet 300 to the surface of the front plate 222 is not limited to suction. The suction sheet 300 may be secured to the front plate 222 or the stage 212 via an adhesive layer or a jig.

Using the suction sheet 300 in combination with an existing chuck stage easily allows various designs of the multilayer stack 100. For example, when the shape, dimensions, number or arrangement pattern of the light-emitting devices 1000 is changed, the suction sheet is replaced by another suction sheet which is suitable to this change, whereby the in-plane distribution of the suction of the stage 212 can be easily changed. In other words, it is only necessary to replace the suction sheet 300 without changing the entirety of the stage 212.

In the present embodiment, the in-plane number density (hereinafter, simply referred to as "density") of the through holes 300H in the first region 300A of the suction sheet 300 is higher than the density of the through holes 300H in the second region 300B. In other words, the aperture ratio of the first region 300A is higher than the aperture ratio of the second region 300B. Therefore, the suction (sucking force) in the second region 300B is smaller than the suction in the first region 300A. The density of the through holes in the second region 300B is about 0-50%, preferably about 0-30%, of the density of the through holes 300H in the first region 300A. In one embodiment, the density of the through holes 300H in the second region 300B may be 0/cm$^2$.

The method of varying the suction between the first region 300A and the second region 300B is not limited to making difference in density of the through holes 300H in the suction sheet 300. By making difference in size and/or shape of the through holes 300H, difference can be made in aperture ratio, whereby the suction can be adjusted. Further, by making the thickness of the second region 300B of the suction sheet 300 smaller than the thickness of the first region 300A, a gap may be formed between the multilayer stack 100 and the second region 300B when the multilayer stack 100 is in contact with the first region 300A. Due to the presence of such a gap, the suction in the second region 300B can be decreased.

By using the stage 212 which has the above-described configuration, in the state shown in FIG. 5A, a plurality of flexible substrate regions 30d of the plastic film 30 which are in contact with the first regions 300A of the stage 212 can respectively be adhered by suction to the first regions 300A of the stage 212. Meanwhile, the suction between the intermediate region 30i of the plastic film 30 and the second region 300B of the stage 212 is not strong.

In the configuration example described with reference to FIG. 9A and FIG. 9B, the shape and size of the first region 300A of the suction sheet 300 which is in contact with the light-emitting device 1000 are identical with the shape and size of the light-emitting device 1000, although the embodiment of the present disclosure is not limited to this example. If the suction in the first region 300A is sufficiently strong, the first region 300A only needs to face at least part of the light-emitting device 1000, rather than the entirety of the light-emitting device 1000.

Figure 10:
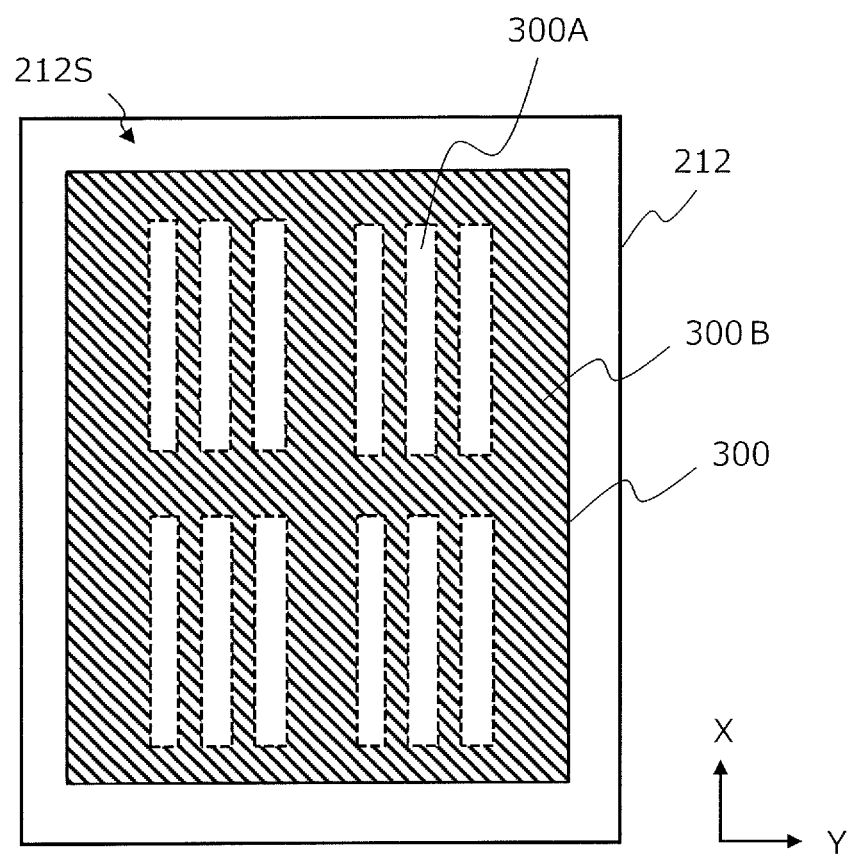
FIG. 10 is a plan view showing a surface in another configuration example of the stage.

FIG. 10 is a plan view showing a suction sheet 300 in another configuration example. The first regions 300A of the suction sheet 300 can have an arbitrary shape and dimensions so long as the first regions 300A hold by suction respective ones of the light-emitting devices 1000 included in the multilayer stack 100 and do not come into contact with the intermediate region 30i of the plastic film 30.

Figure 11A:
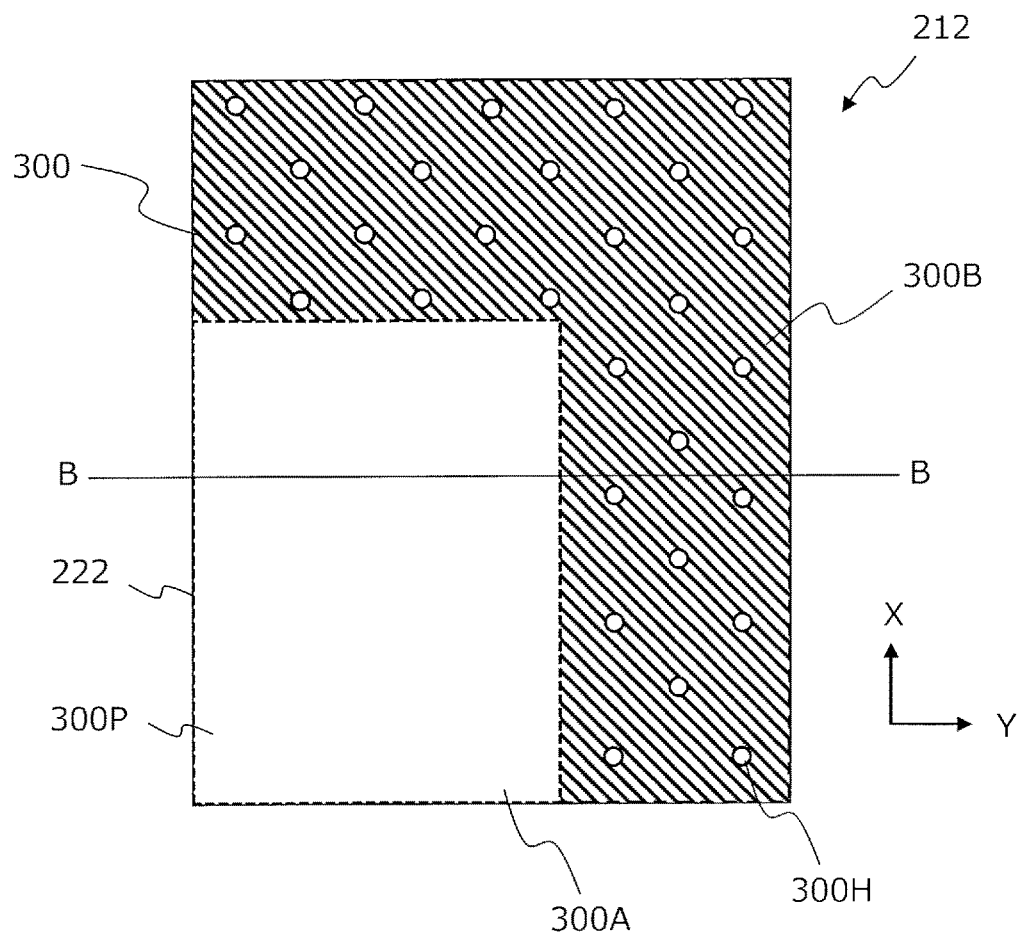
FIG. 11A is a schematic diagram enlargedly showing a portion in the vicinity of the boundary between the first region and the second region of the surface in still another configuration example of the stage.
Figure 11B:
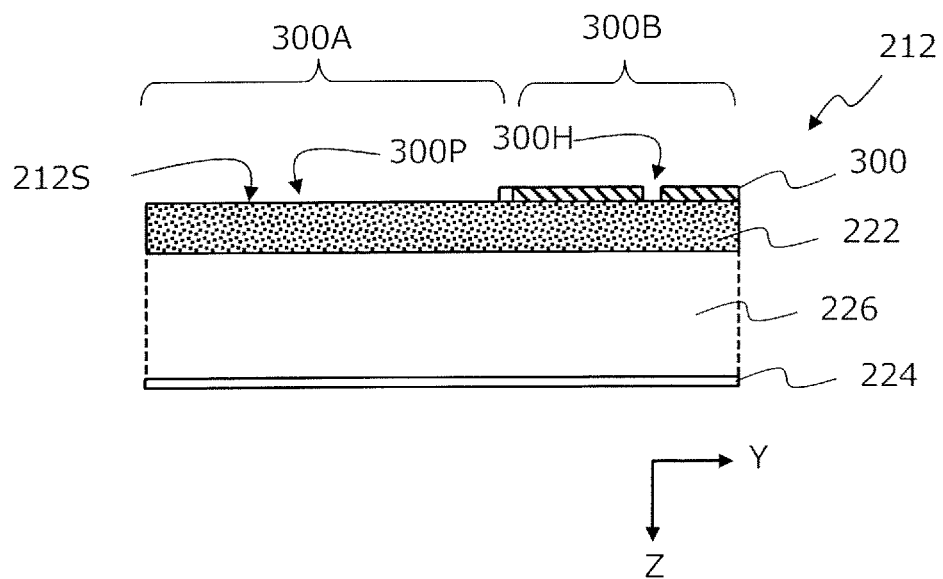
FIG. 11B is a cross-sectional view taken along line B-B of FIG. 11A.

FIG. 11A is a schematic diagram enlargedly showing a portion in the vicinity of the boundary between the first region 300A and the second region 300B in another configuration example of the suction sheet 300. FIG. 11B is a cross-sectional view taken along line B-B of FIG. 11A. In this example, the first region 300A is defined by a large opening 300P through which the surface 212S of the front plate 222 that is made of a porous material is exposed. Meanwhile, the second region 300B covers the surface 212S of the front plate 222 that is made of a porous material, thereby performing the function of reducing the suction. In the example illustrated in the drawings, the second region 300B has the through holes 300H, although the through holes 300H are not indispensable in the second region 300B.

Configuration Example 3 of Stage

Figure 12A:
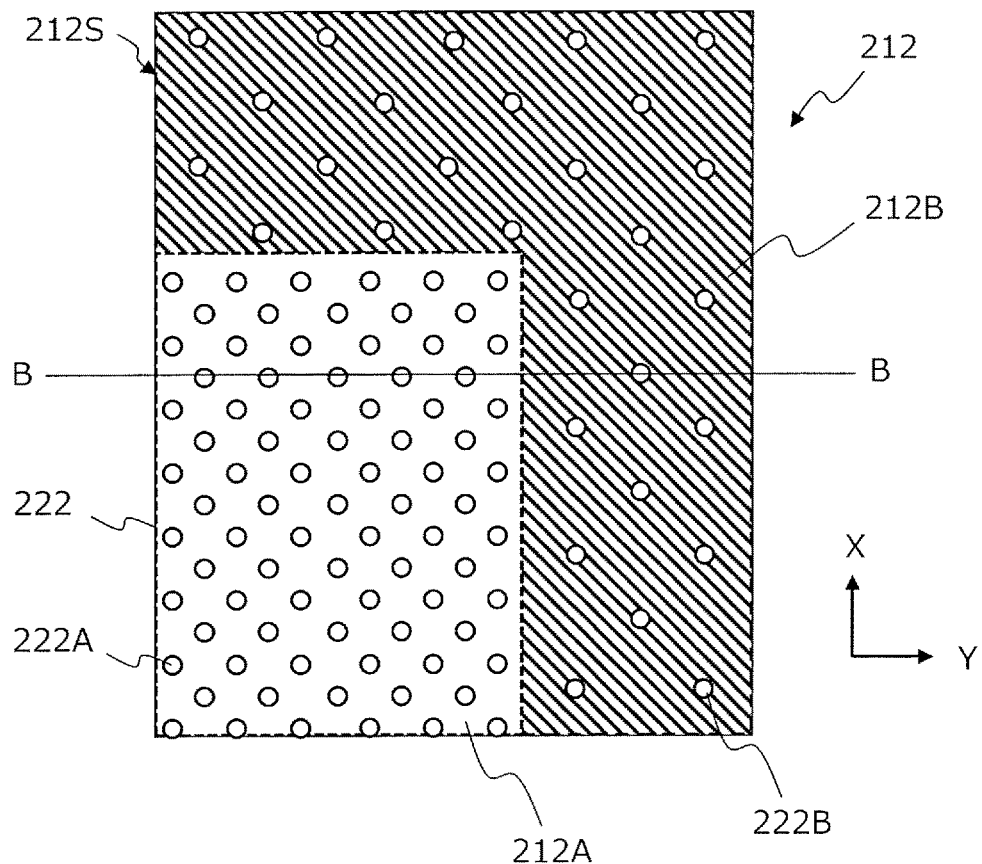
FIG. 12A is a schematic diagram enlargedly showing a portion in the vicinity of the boundary between the first region and the second region of the surface in another configuration example of the stage.
Figure 12B:
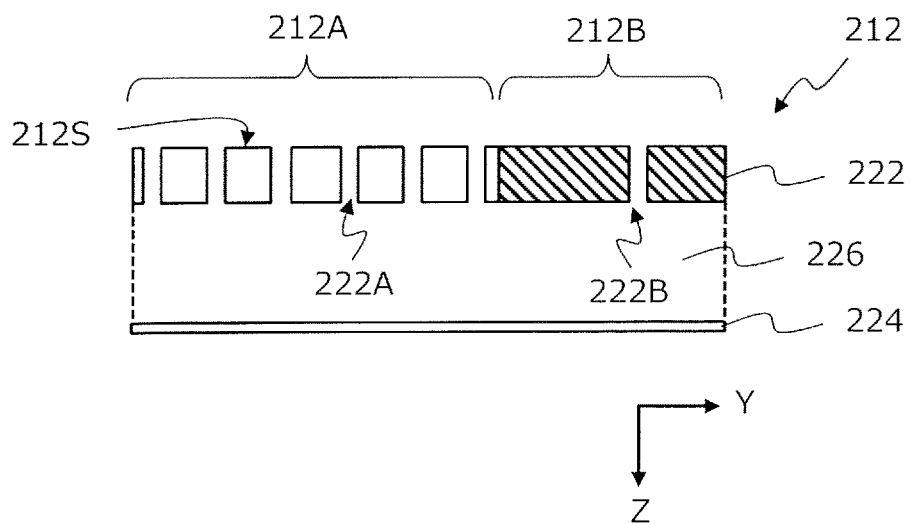
FIG. 12B is a cross-sectional view taken along line B-B of FIG. 12A.

FIG. 12A is a schematic diagram enlargedly showing a portion in the vicinity of the boundary between the first region 212A and the second region 212B in a stage 212 in which the front plate 222 is realized by a plate which has through holes, rather than a plate which is made of a porous material. FIG. 12B is a cross-sectional view taken along line B-B of FIG. 12A.

In this example, the density or aperture ratio of through holes 222A in the first region 212A is higher than the density or aperture ratio of through holes 222B in the second region 212B. Thus, the suction in the second region 212B is smaller than the suction in the first region 212A.

As described herein, the stage 212 may have a plurality of regions of different suctions.

Configuration Example 4 of Stage

In the present embodiment, the second region 212B of the stage 212 may have ejection holes from which a fluid can be ejected toward the intermediate region 30i of the plastic film 30. A typical example of the fluid is a gas, such as air or nitrogen.

Figure 13A:
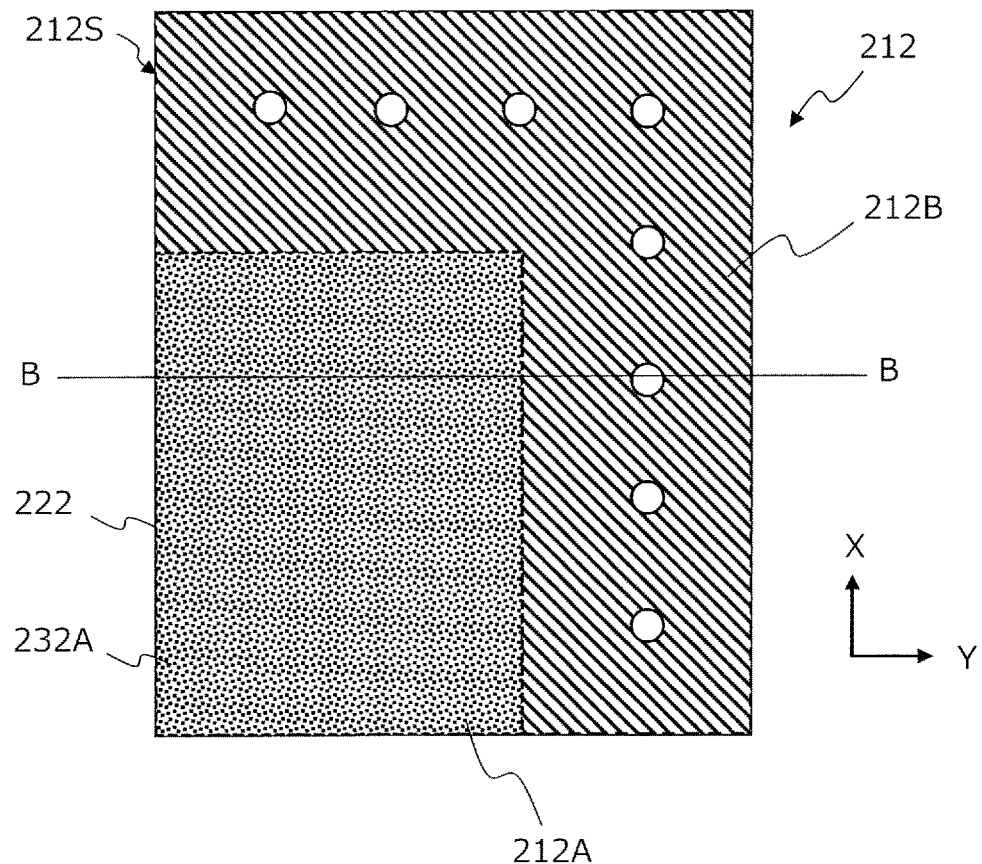
FIG. 13A is a schematic diagram enlargedly showing a portion in the vicinity of the boundary between the first region and the second region in still another configuration example of the stage.
Figure 13B:
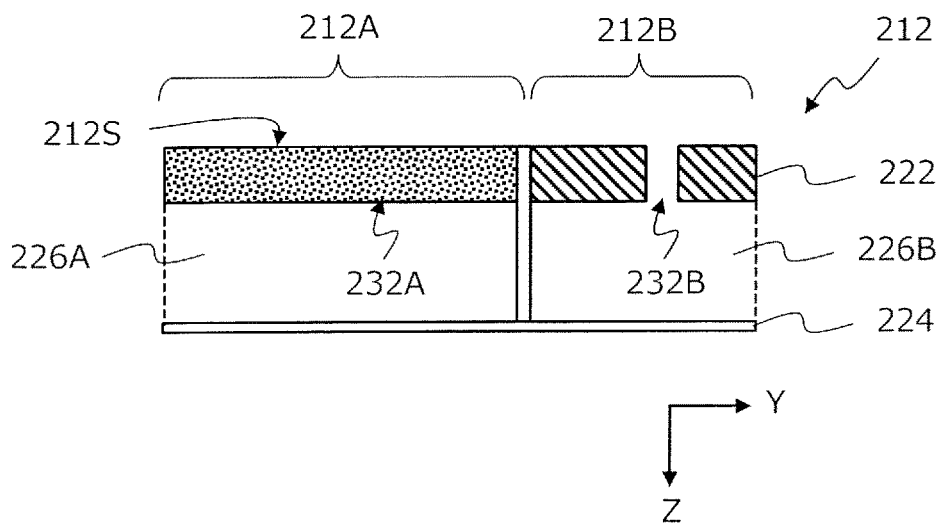
FIG. 13B is a cross-sectional view taken along line B-B of FIG. 13A.

FIG. 13A is a schematic diagram enlargedly showing a portion in the vicinity of the boundary between the first region 212A and the second region 212B. FIG. 13B is a cross-sectional view taken along line B-B of FIG. 13A. In this example, the stage 212 includes a front plate 222 which has a porous portion 232A in the first region 212A and a rear plate 224 which is parallel to the front plate 222 as shown in FIG. 13B. The second region 212B of the front plate 222 has ejection holes (gas ejection holes) 232B instead of the porous portion 232A. Between the front plate 222 and the rear plate 224, there are a first space 226A and a second space 226B which are divided by a partition. The first space 226A is in communication with the outside via a large number of pores of the porous portion 232A of the first region 212A. Meanwhile, the second space 226B is in communication with the outside via the ejection holes 232B of the second region 212B.

The first space 226A is connected with a suction unit (not shown), such as a decompression pump. During operation, the suction unit makes the first space 226A have a negative pressure, so that external air flows into the first space 226A via the porous portion 232A of the first regions 212A. Therefore, an object which is in contact with the first regions 212A of the front plate 222 is sucked by the porous portion 232A and, as a result, adhered by suction to the stage 212.

The second space 226B is connected with a compressor (not shown) such as a compression pump. During operation, the compressor makes the second space 226B have a positive pressure, so that air is ejected from the second space 226B to the outside via the ejection holes 232B of the second region 212B. Therefore, an object which is in contact with the second region 212B of the front plate 222 moves away from the ejection holes 232B and becomes detached from the stage 212.

The first regions 212A of the front plate 222 can be made of various porous materials. The porosity of the porous material is in the range of, for example, not less than 20% and not more than 60%. The average pore diameter is in the range of, for example, not less than 5 μm and not more than 600 μm. An example of the porous material is a sintered metallic or ceramic mass or a resin. The thickness of the porous material is in the range of, for example, not less than 1 mm and not more than 50 mm. The inside diameter of the ejection holes 232B in the second region 212B of the front plate 222 is in the range of, for example, several hundreds of micrometers to several millimeters.

In the example of FIG. 13A, the ejection holes 232B are linearly aligned at equal intervals. The embodiment of the present disclosure is not limited to this example. The ejection holes 232B may be positioned on one or more curves or bent lines. The arrangement of the ejection holes 232B does not need to occur at equal intervals. The distance between the centers of two adjoining ejection holes 232B is, for example, several millimeters to 3 cm.

The timing of ejection of a fluid, such as air, from the second space 226B to the outside via the ejection holes 232B occurs at execution of the process of FIG. 5C. It is not necessary to eject the fluid from the ejection holes 232B at any other timing. Thus, before execution of the separation step, the second space 226B may have a negative pressure as does the first space 226A. In that case, the ejection holes 232B can contribute to suction of the multilayer stack 100 as well as the porous portion 232A of the first regions 212A.

By using the stage 212 that has the above-described configuration, the plurality of flexible substrate regions 30d of the plastic film 30 which are in contact with the first regions 212A of the stage 212 in the state shown in FIG. 5A can be strongly adhered by suction to the first regions 212A of the stage 212. Meanwhile, between the intermediate region 30i of the plastic film 30 and the second region 212B of the stage 212, the intermediate region 30i can be delaminated from the surface 212S of the stage 212 at least at the timing of ejection of the fluid. As a result, the intermediate region 30i of the plastic film 30 can readily separate from the stage 212.

In this configuration example, the shape and size of the first regions 212A which are in contact with the light-emitting devices 1000 are identical with the shape and size of the light-emitting devices 1000. However, the embodiment of the present disclosure is not limited to this example. If the suction in the first regions 212A is sufficiently strong, the first regions 212A only needs to face at least part of each of the light-emitting devices 1000, rather than the entirety of the light-emitting device 1000.

FIG. 10 shows another arrangement example of the first regions 212A. The shape and size of the first regions 212A are arbitrary so long as respective ones of the light-emitting devices 1000 included in the multilayer stack 100 can be tightly adhered by suction to the first regions 212A. Note that, however, the ejection holes 232B are located in a region which is to face the intermediate region 30i of the plastic film 30.

In the present embodiment, the stage 212 includes a plurality of porous portions 232A in the first regions 212A and holds the multilayer stack 100 by means of a negative pressure. However, the stage of the present disclosure is not limited to this example. For example, the stage may include an electrostatic chuck. Alternatively, the stage may include an adhesive layer, instead of the porous portions 232A, in the first regions 212A. Such stages can realize the above-described function so long as they have a plurality of ejection holes 232B in a region which is to face the intermediate region 30i of the plastic film 30 (second region 212B).

When the stage 212 has any of the above-described configurations, the intermediate region 30i of the plastic film 30 in the state of FIG. 5B can be readily removed from the stage 212.

<Steps after Delaminating>

Figure 14:
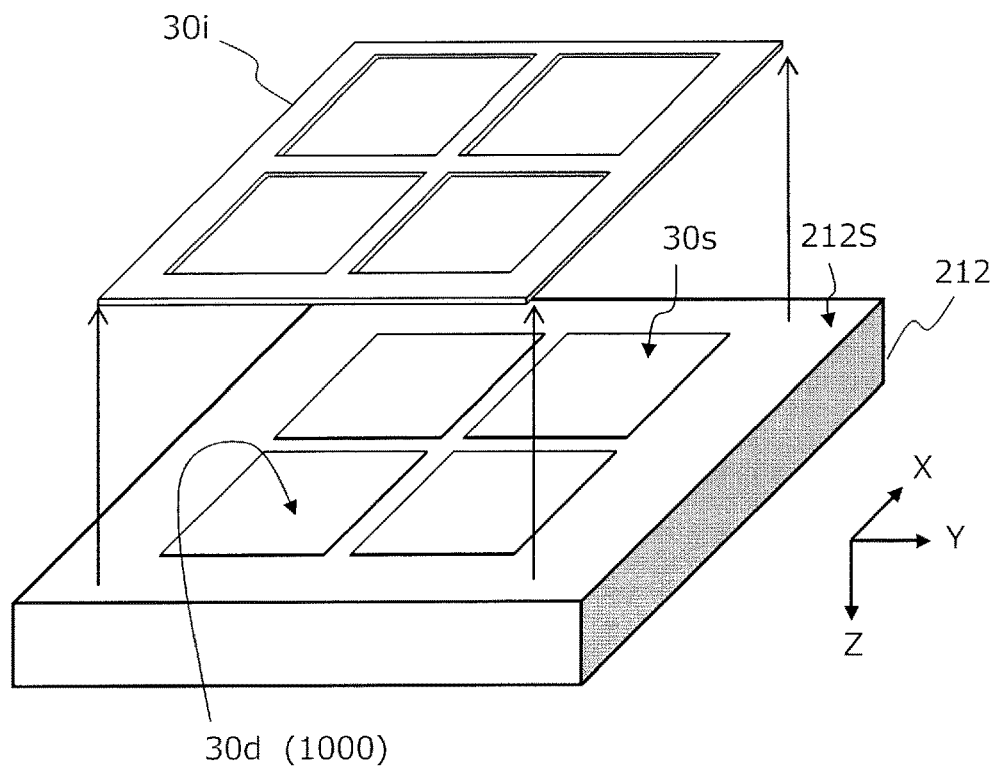
FIG. 14 is a perspective view showing removal of an intermediate region of a plastic film from the stage.

FIG. 14 is a perspective view showing removal of the intermediate region 30i of the plastic film 30 from the first portion 110 (light-emitting devices 1000) of the multilayer stack 100 adhered by suction to the stage 212.

Figure 15:
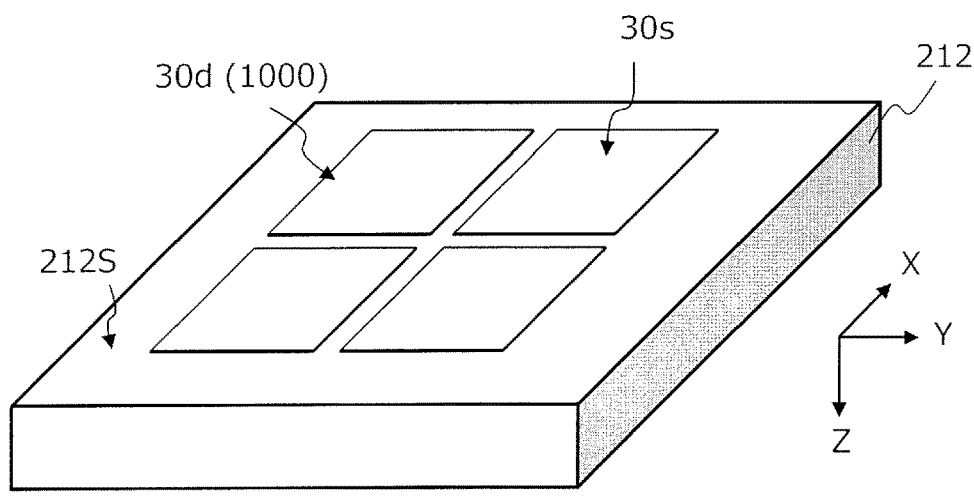
FIG. 15 is a perspective view showing the stage from which the intermediate region of the plastic film has been removed.

FIG. 15 is a perspective view showing light-emitting devices 1000 adhered by suction to the stage 212. To the stage 212, a plurality of light-emitting devices 1000 arrayed in rows and columns are adhered by suction. In the example of FIG. 15, a part of the plastic film 30, specifically the surface (delaminated surface) 30s of the flexible substrate regions 30d of the respective light-emitting devices 1000, is exposed.

Figure 16:
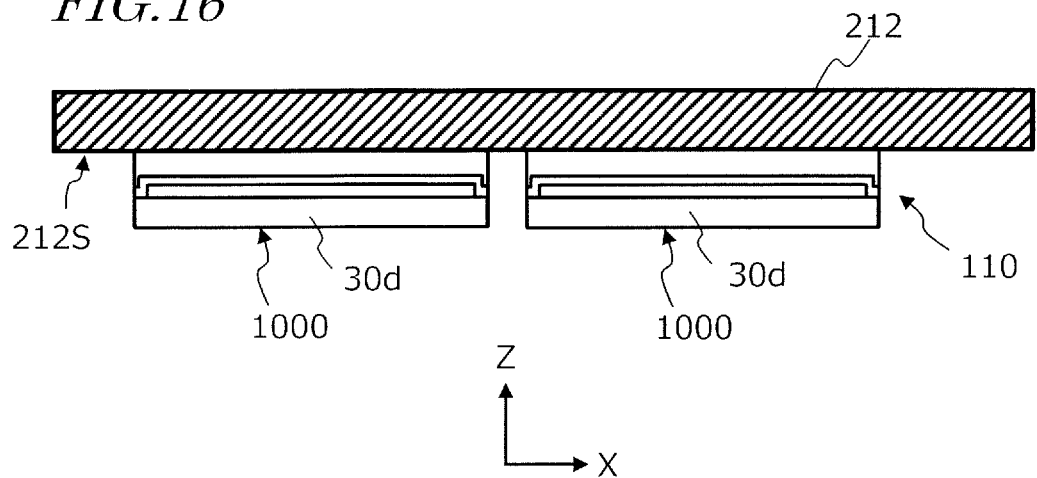
FIG. 16 is a cross-sectional view showing the stage from which the intermediate region of the plastic film has been removed.

FIG. 16 is a cross-sectional view showing that the stage 212 holds the light-emitting devices 1000 by suction. This cross section is parallel to the ZX plane. The direction of the Z-axis of FIG. 16 is opposite to the direction of the Z-axis of FIG. 14 and FIG. 15.

Various processes can be sequentially or concurrently performed on the plurality of light-emitting devices 1000 which are in contact with the stage 212.

The "processes" to be performed on the light-emitting devices 1000 can include attaching a dielectric and/or electrically-conductive film to each of the plurality of light-emitting devices 1000, cleaning or etching each of the plurality of light-emitting devices 1000, and mounting an optical part and/or an electronic part to each of the plurality of light-emitting devices 1000. Specifically, a part such as, for example, a polarizer, encapsulation film, touchscreen, heat radiation sheet, electromagnetic shield, driver integrated circuit, or the like, can be mounted to the flexible substrate region 30d of each of the light-emitting devices 1000. The sheet-like part includes a functional film which can add an optical, electrical or magnetic function to the light-emitting devices 1000.

The plurality of light-emitting devices 1000 are supported by the stage 212 such that the light-emitting devices 1000 are adhered by suction to the stage 212. The various processes which are to be performed on each of the light-emitting devices 1000 can be efficiently carried out.

The surface 30s of the plastic film 30 delaminated from the glass base 10 is active. Therefore, the surface 30s may be covered with a protection film or subjected to a surface treatment for conversion to a hydrophobic surface before various parts are mounted to the surface 30s.

Figure 17:
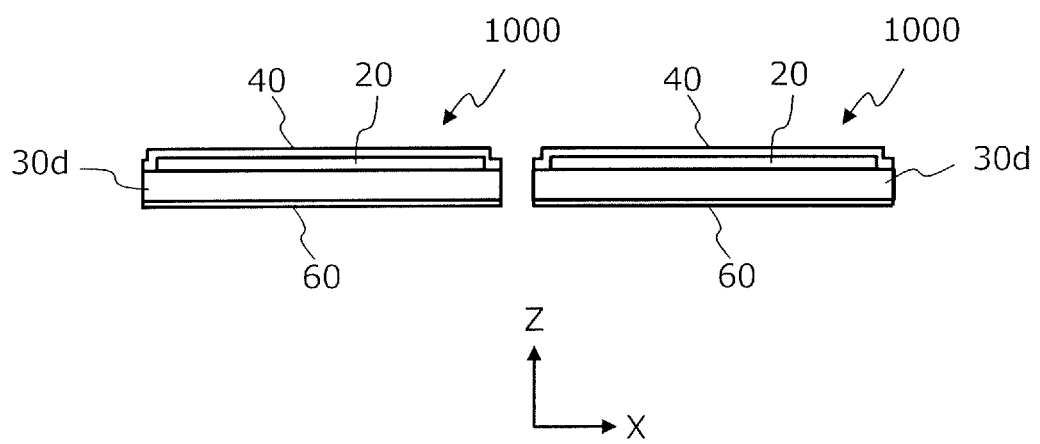
FIG. 17 is a cross-sectional view showing flexible light-emitting devices detached from the stage.

FIG. 17 is a cross-sectional view schematically showing the light-emitting devices 1000 detached from the stage 212 after the sheet-like part (functional film) 60 is mounted to the light-emitting devices 1000.

According to the prior art, the plastic film is delaminated from the glass base before the light-emitting devices 1000 are divided from one another. Therefore, when a subsequent process is carried out, a large number of light-emitting devices 1000 are bound to a single plastic film. Thus, it is difficult to carry out an efficient process on each of the light-emitting devices 1000. When the light-emitting devices 1000 are divided from one another after the sheet-like part is attached, a portion of the sheet-like part which is present in an intermediate region between adjoining two of the light-emitting devices 1000 is useless.

On the other hand, according to the embodiment of the present disclosure, a large number of light-emitting devices 1000 are still orderly arrayed on the stage 212 after being delaminated from the glass base 10. Therefore, various processes can be efficiently performed on the light-emitting devices 1000 sequentially or concurrently.

Figure 18:
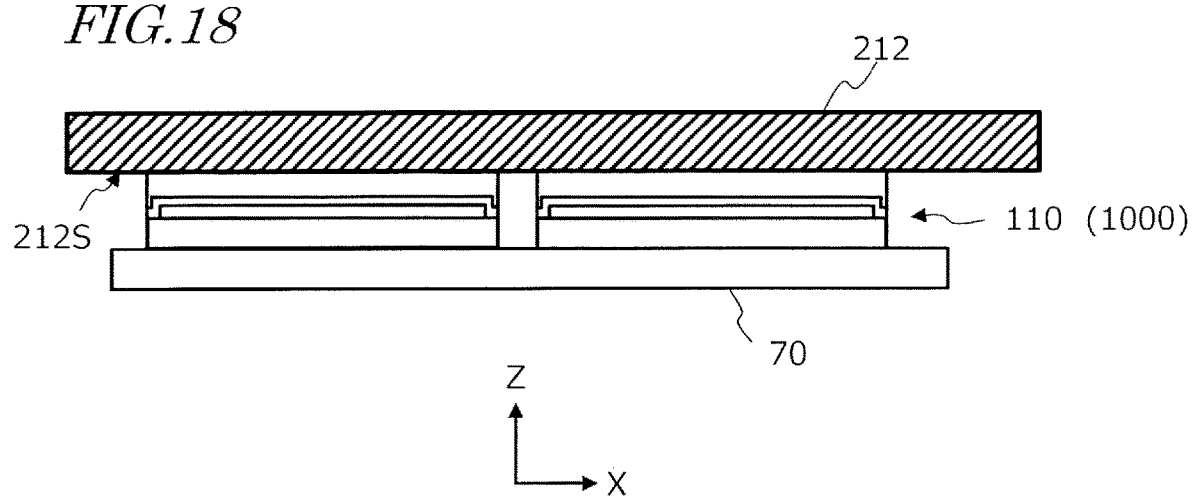
FIG. 18 is a cross-sectional view showing another protection sheet bound to a plurality of light-emitting devices which are in contact with the stage.

After the step of separating the multilayer stack 100 into the first portion 110 and the second portion 120 is carried out and the unnecessary portion is removed from the stage 212, the step of adhering another protection sheet (second protection sheet) 70 to the plurality of light-emitting devices 1000 which are in contact with the stage 212 may be further performed as shown in FIG. 18. The second protection sheet 70 can perform the function of temporarily protecting the surface of the flexible substrate regions 30d of the plastic film 30 delaminated from the glass base 10. The second protection sheet 70 can have the same laminate structure as that of the previously-described protection sheet 50. The protection sheet 50 can be referred to as "first protection sheet 50".

The second protection sheet 70 may be adhered to the plurality of light-emitting devices 1000 after various processes which have previously been described are performed on the plurality of light-emitting devices 1000 which are in contact with the stage 212.

When suction of the light-emitting devices 1000 by the stage 212 is stopped after the second protection sheet 70 is adhered, the plurality of light-emitting devices 1000 which are bound to the second protection sheet 70 can be detached from the stage 212. Thereafter, the second protection sheet 70 can function as a carrier for the plurality of light-emitting devices 1000. This is transfer of the light-emitting devices 1000 from the stage 212 to the second protection sheet 70. Various processes may be sequentially or concurrently performed on the plurality of light-emitting devices 1000 which are bound to the second protection sheet 70.

Figure 19:
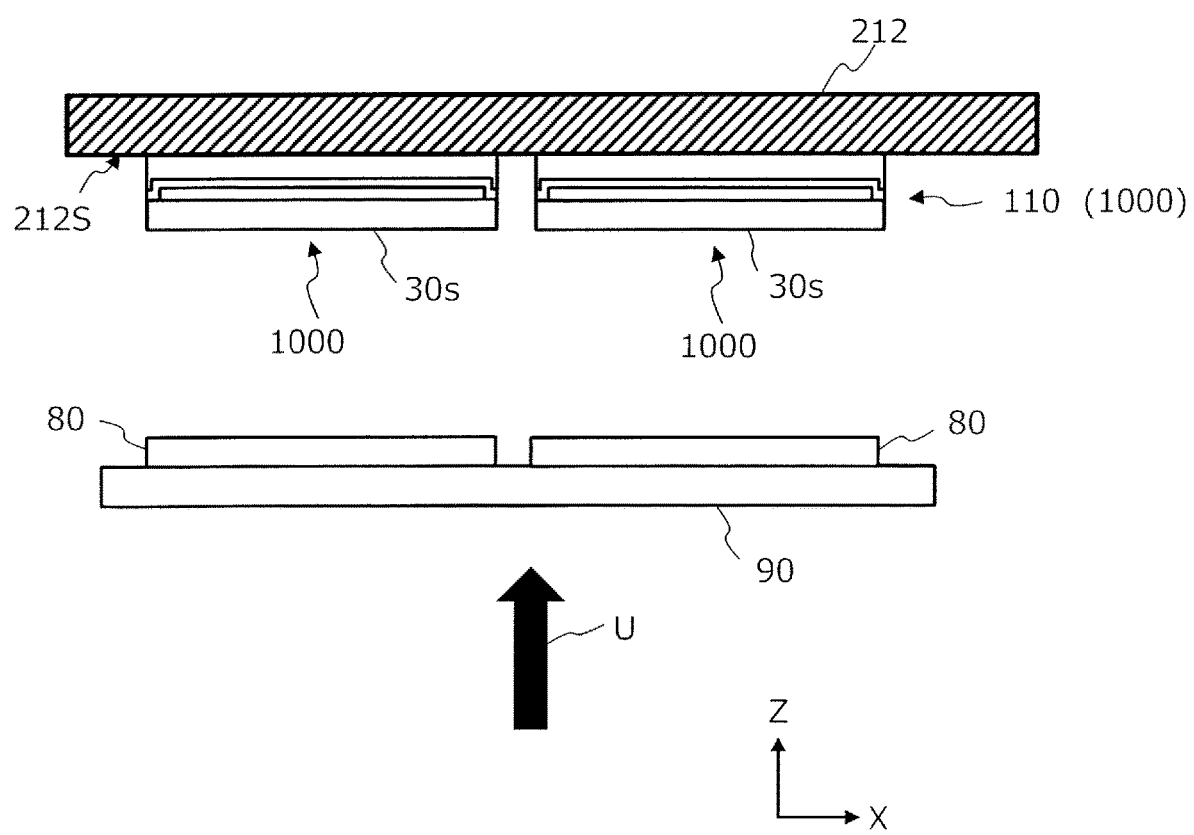
FIG. 19 is a cross-sectional view showing a carrier sheet carrying a plurality of parts which are to be mounted to the plurality of light-emitting devices.

FIG. 19 is a cross-sectional view showing a carrier sheet 90 carrying a plurality of parts (functional films) 80 which are to be mounted to the plurality of light-emitting devices 1000. By moving this carrier sheet 90 in the direction of arrow U, the respective parts 80 can be attached to the light-emitting devices 1000. The upper surface of the parts 80 has an adhesive layer which is capable of strongly adhering to the light-emitting devices 1000. Meanwhile, the adhesion between the carrier sheet 90 and the parts 80 is relatively weak. Using such a carrier sheet 90 enables a simultaneous "transfer" of the parts 80. Such a transfer is readily realized because the plurality of light-emitting devices 1000 are regularly arrayed on the stage 212 while the light-emitting devices 1000 are supported by the stage 212.

Hereinafter, the configuration of the multilayer stack 100 before the cutting illustrated in FIG. 2A and FIG. 2B is described in more detail.

Figure 20A:
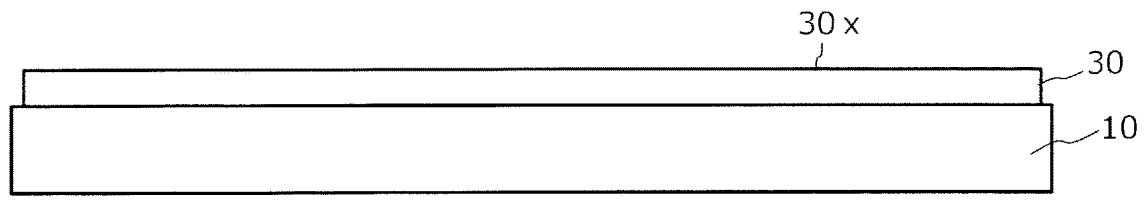
FIG. 20A is a cross-sectional view illustrating a step of the flexible light-emitting device production method in an embodiment of the present disclosure.

First, see FIG. 20A. FIG. 20A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 μm and not more than 100 μm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 10s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet lift-off light transmitted through the glass base 10. A part of the plastic film 30 at the interface with the glass base 10 needs to absorb the ultraviolet lift-off light and decompose (disappear). Alternatively, for example, a sacrificial layer which is to absorb lift-off light of a certain wavelength band and produce a gas may be provided between the glass base 10 and the plastic film 30. In this case, the plastic film 30 can be easily delaminated from the glass base 10 by irradiating the sacrificial layer with the lift-off light. Providing the sacrificial layer also achieves the effect of suppressing generation of ashes.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film may be formed on the plastic film 30. The gas barrier film can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Hereinafter, the process of forming the functional layer regions 20, including the TFT layer 20A and the light-emitting device layer 20B, and the upper gas barrier film 40 is described.

Figure 20B:
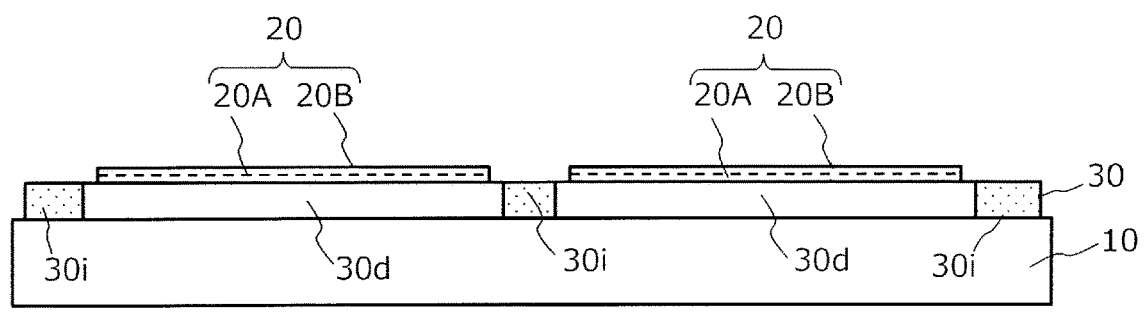
FIG. 20B is a cross-sectional view illustrating a step of the flexible light-emitting device production method in an embodiment of the present disclosure.

First, as shown in FIG. 20B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and a light-emitting device layer 20B (upper layer). The TFT layer 20A and the light-emitting device layer 20B are sequentially formed by a known method. When the light-emitting device is a display, the TFT layer 20A includes a circuit of a TFT array which realizes an active matrix. The light-emitting device layer 20B includes an array of light-emitting devices (OLED devices and/or micro LED devices), each of which can be driven independently.

The chip size of the micro LED devices is, for example, smaller than 100 µm×100 µm. The micro LED devices can be made of different inorganic semiconductor materials according to the color or wavelength of light to be radiated. Identical semiconductor chips may include a plurality of semiconductor multilayer stacks of different compositions such that light of different colors, R (red), G (green) and B (blue), are radiated from the respective semiconductor multilayer stacks. As well known in the art, a semiconductor chip which radiates ultraviolet light or a semiconductor chip which radiates blue light may be combined with various phosphor materials such that light of R, G and B are radiated.

The thickness of the TFT layer 20A is, for example, about 4 µm. The thickness of the light-emitting device layer 20B including the OLED devices is, for example, 1 µm. The thickness of the light-emitting device layer 20B including the micro LED devices can be, for example, not less than 10 µm.

Figure 21:
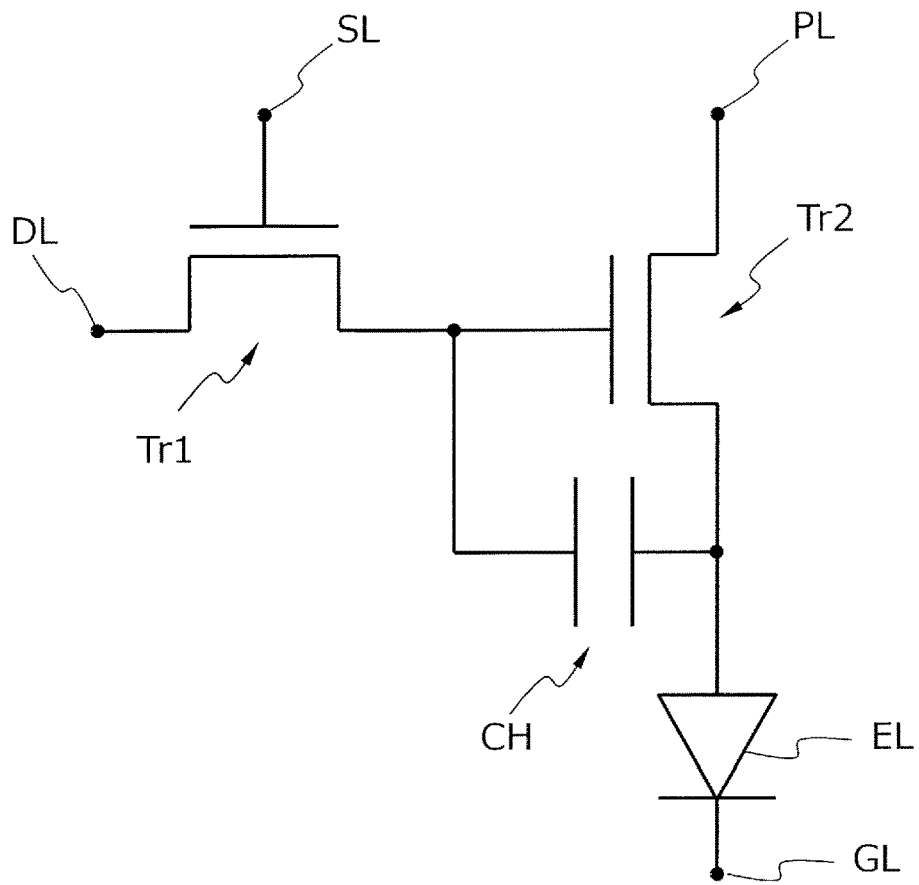
FIG. 21 is an equivalent circuit diagram of a single sub-pixel in a flexible light-emitting device.

FIG. 21 is a basic equivalent circuit diagram of a sub-pixel in a display which is an example of the light-emitting device. A single pixel of the display can consist of sub-pixels of different colors such as, for example, R, G, and B. The example illustrated in FIG. 21 includes a selection TFT element Tr1, a driving TFT element Tr2, a storage capacitor CH, and a light-emitting device EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the light-emitting device EL. When the driving TFT element Tr2 is ON, an electric current flows from the power line PL to a ground line GL via the light-emitting device EL. This electric current allows the light-emitting device EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The light-emitting device layer 20B includes a light-emitting device EL. Before formation of the light-emitting device layer 20B, the upper surface of the TFT layer 20A is planarized by an interlayer insulating film that covers the TFT array and various wires. A structure which supports the light-emitting device layer 20B and which realizes active matrix driving of the light-emitting device layer 20B is referred to as "backplane".

The circuit elements and part of the lines shown in FIG. 21 can be included in any of the TFT layer 20A and the light-emitting device layer 20B. The lines shown in FIG. 21 are connected with an unshown driver circuit.

In the embodiment of the present disclosure, the TFT layer 20A and the light-emitting device layer 20B can have various specific configurations. These configurations do not limit the present disclosure. The TFT element included in the TFT layer 20A may have a bottom gate type configuration or may have a top gate type configuration. Emission by the light-emitting device included in the light-emitting device layer 20B may be of a bottom emission type or may be of a top emission type. The specific configuration of the light-emitting device is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 20C:
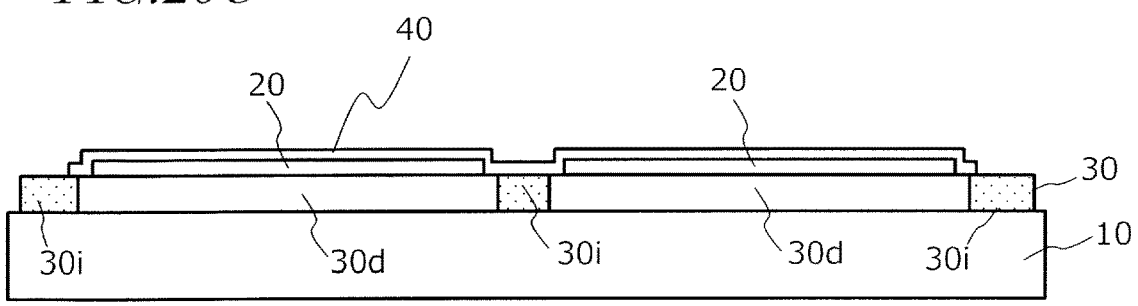
FIG. 20C is a cross-sectional view illustrating a step of the flexible light-emitting device production method in an embodiment of the present disclosure.

After formation of the above-described functional layer, the entirety of the functional layer regions 20 is covered with a gas barrier film (upper gas barrier film) 40 as shown in FIG. 20C. A typical example of the upper gas barrier film 40 is a multilayer film including an inorganic material layer and an organic material layer. Elements such as an adhesive film, another functional layer which is a constituent of a touch-screen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. When the light-emitting device layer 20B includes OLED devices, from the viewpoint of encapsulation reliability, the WVTR (Water Vapor Transmission Rate) of a thin film encapsulation structure is typically required to be not more than $1\times10^{-4}$ g/m$^2$/day. According to the embodiment of the present disclosure, this criterion is met. The thickness of the upper gas barrier film 40 is, for example, not more than 1.5 μm.

Figure 22:
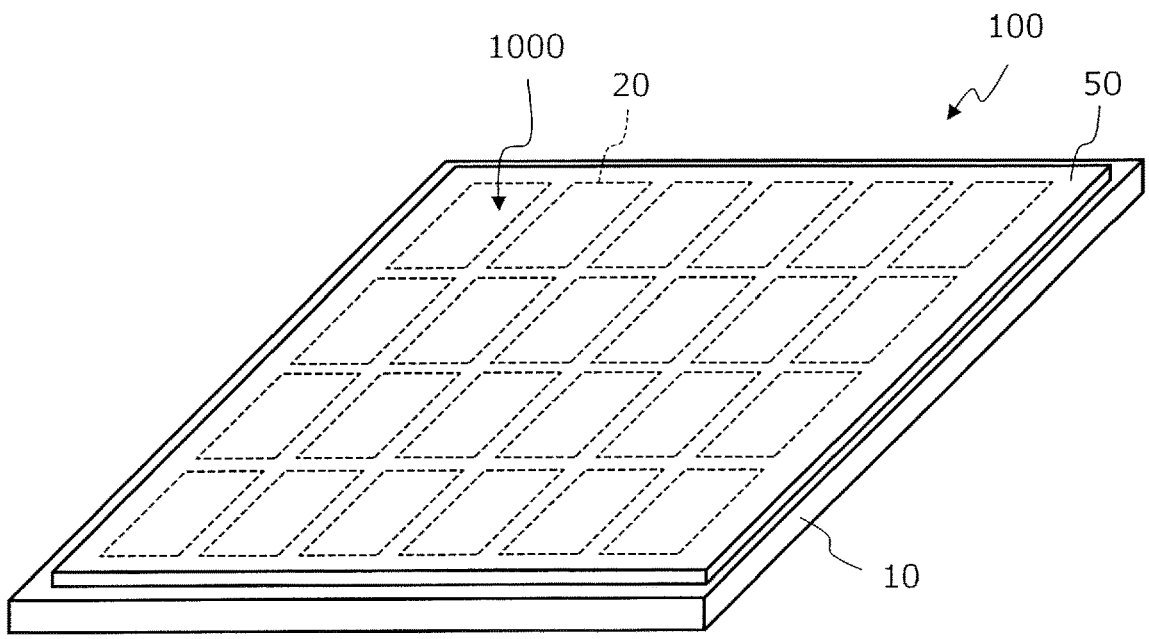
FIG. 22 is a perspective view of the multilayer stack in the middle of the production process.

FIG. 22 is a perspective view schematically showing the upper surface side of the multilayer stack 100 at a point in time when the upper gas barrier film 40 is formed. A single multilayer stack 100 includes a plurality of light-emitting devices 1000 supported by the glass base 10. In the example illustrated in FIG. 22, a single multilayer stack 100 includes a larger number of functional layer regions 20 than in the example illustrated in FIG. 1A. As previously described, the number of functional layer regions 20 supported by a single glass base 10 is arbitrary.

<Protection Sheet>

Figure 20D:
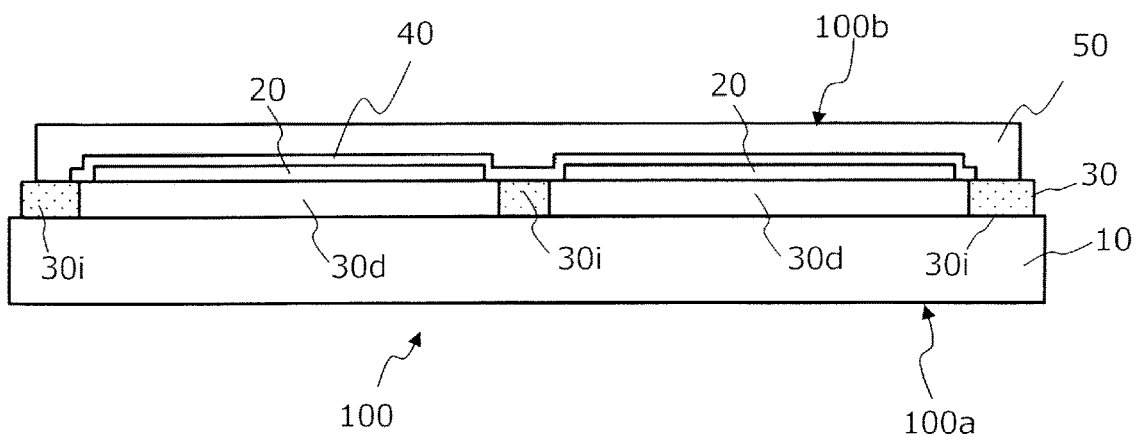
FIG. 20D is a cross-sectional view illustrating a step of the flexible light-emitting device production method in an embodiment of the present disclosure.

Next, refer to FIG. 20D. As shown in FIG. 20D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 μm and not more than 150 μm.

After the thus-formed multilayer stack 100 is provided, the production method of the present disclosure can be carried out using the above-described production apparatus (delaminating apparatus 220).

INDUSTRIAL APPLICABILITY

An embodiment of the present invention provides a novel flexible light-emitting device production method. A flexible light-emitting device is broadly applicable to smartphones, tablet computers, on-board displays, and small-, medium- and large-sized television sets. The flexible light-emitting device can also be used as an illumination device.

REFERENCE SIGNS LIST

10 . . . glass base, 20 . . . functional layer region, 20A . . . TFT layer, 20B . . . light-emitting device layer, 30 . . . plastic film, 30d . . . flexible substrate region of plastic film, 30i . . . intermediate region of plastic film, 40 . . . gas barrier film, 50 . . . protection sheet, 100 . . . multilayer stack, 212 . . . stage, 220 . . . lift-off light irradiation unit (delaminating apparatus), 1000 . . . light-emitting device

The invention claimed is:

1. A method for producing a flexible light-emitting device, comprising:
providing a multilayer stack which has a first surface and a second surface, the multilayer stack including
a glass base which defines the first surface,
a functional layer region including a TFT layer and a light-emitting device layer,
a synthetic resin film provided between the glass base and the functional layer region and bound to the glass base, the synthetic resin film including a flexible substrate region supporting the functional layer region and an intermediate region surrounding the flexible substrate region, and
a protection sheet which covers the functional layer region and which defines the second surface;
dividing the intermediate region and the flexible substrate region of the synthetic resin film from each other so that the intermediate region has a single continuous sheet-like structure that has openings;
irradiating an interface between the synthetic resin film and the glass base with lift-off light; and
separating the multilayer stack into a first portion and a second portion by increasing a distance from a stage to the glass base while the second surface of the multilayer stack is kept in contact with the stage,
wherein the first portion of the multilayer stack includes the intermediate region of the synthetic resin film and a light-emitting device which are adhered to the stage, the light-emitting device including the functional layer region and the flexible substrate region of the synthetic resin film, and the second portion of the multilayer stack includes the glass base, and
the method further comprises removing the intermediate region of the synthetic resin film adhered to the stage from the stage while the light-emitting device is kept adhered to the stage, and
wherein the lift-off light is incoherent light.

2. The method of claim 1, further comprising, after removing the intermediate region of the synthetic resin film from the stage, performing a process on the light-emitting device which is in contact with the stage.

3. The method of claim 2, wherein the process includes any of attaching a dielectric and/or electrically-conductive film to the light-emitting device, cleaning or etching the light-emitting device, and mounting an optical part and/or an electronic part to the light-emitting device.

4. The method of claim 1, wherein separating the multilayer stack into the first portion and the second portion is carried out while the stage holds the second surface of the multilayer stack.

5. The method of claim 4, wherein irradiating the interface between the synthetic resin film and the glass base with the lift-off light is carried out while the stage holds the second surface of the multilayer stack.

6. The method of claim 1, wherein
a surface of the stage includes a first region which is to face the light-emitting device and a second region which is to face the intermediate region of the synthetic resin film, and
suction in the first region is higher than suction in the second region.

7. The method of claim 1, further comprising, before bringing the second surface of the multilayer stack into contact with the stage, placing a suction sheet on the stage, the suction sheet having a plurality of openings,
wherein the stage includes a porous plate on which the suction sheet is to be placed, and
the suction sheet includes a first region which is to be in contact with the light-emitting device and a second region which is to face the intermediate region of the synthetic resin film, an aperture ratio of the first region being higher than an aperture ratio of the second region.

8. A method for producing a flexible light-emitting device, comprising:
providing a multilayer stack which has a first surface and a second surface, the multilayer stack including
a glass base which defines the first surface,
a functional layer region including a TFT layer and a light-emitting device layer,
a synthetic resin film provided between the glass base and the functional layer region and bound to the glass base, the synthetic resin film including a flexible substrate region supporting the functional layer region and an intermediate region surrounding the flexible substrate region, and
a protection sheet which covers the functional layer region and which defines the second surface;
dividing the intermediate region and the flexible substrate region of the synthetic resin film from each other so that the intermediate region has a single continuous sheet-like structure that has openings;
irradiating an interface between the synthetic resin film and the glass base with lift-off light; and
separating the multilayer stack into a first portion and a second portion by increasing a distance from a stage to the glass base while the second surface of the multilayer stack is kept in contact with the stage,
wherein the first portion of the multilayer stack includes the intermediate region of the synthetic resin film and a light-emitting device which are adhered to the stage, the light-emitting device including the functional layer region and the flexible substrate region of the synthetic resin film, and the second portion of the multilayer stack includes the glass base, and
the method further comprises removing the intermediate region of the synthetic resin film adhered to the stage from the stage while the light-emitting device is kept adhered to the stage, and
wherein
the light-emitting device layer includes a plurality of arrayed micro LEDs, and
the lift-off light is laser light.

9. The method of claim 8, further comprising, after removing the intermediate region of the synthetic resin film from the stage, performing a process on the light-emitting device which is in contact with the stage.

10. The method of claim 9, wherein the process includes any of attaching a dielectric and/or electrically-conductive film to the light-emitting device, cleaning or etching the light-emitting device, and mounting an optical part and/or an electronic part to the light-emitting device.

11. The method of claim 8, wherein separating the multilayer stack into the first portion and the second portion is carried out while the stage holds the second surface of the multilayer stack.

12. The method of claim 11, wherein irradiating the interface between the synthetic resin film and the glass base with the lift-off light is carried out while the stage holds the second surface of the multilayer stack.

13. The method of claim 8, wherein
a surface of the stage includes a first region which is to face the light-emitting device and a second region which is to face the intermediate region of the synthetic resin film, and
suction in the first region is higher than suction in the second region.

14. The method of claim 8, further comprising, before bringing the second surface of the multilayer stack into contact with the stage, placing a suction sheet on the stage, the suction sheet having a plurality of openings,
wherein the stage includes a porous plate on which the suction sheet is to be placed, and
the suction sheet includes a first region which is to be in contact with the light-emitting device and a second region which is to face the intermediate region of the synthetic resin film, an aperture ratio of the first region being higher than an aperture ratio of the second region.

* * * * *